(12) United States Patent
Yamazaki

(10) Patent No.: US 9,793,414 B2
(45) Date of Patent: *Oct. 17, 2017

(54) OXIDE SEMICONDUCTOR FILM

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/012,944

(22) Filed: Feb. 2, 2016

(65) Prior Publication Data
US 2016/0149048 A1    May 26, 2016

Related U.S. Application Data

(63) Continuation of application No. 14/294,626, filed on Jun. 3, 2014, now Pat. No. 9,287,352.

(30) Foreign Application Priority Data

Jun. 19, 2013    (JP) .................................. 2013-128481

(51) Int. Cl.
*H01L 29/786*    (2006.01)
*H01L 21/02*    (2006.01)
(Continued)

(52) U.S. Cl.
CPC ........ *H01L 29/7869* (2013.01); *C01G 15/006* (2013.01); *H01L 21/02565* (2013.01);
(Continued)

(58) Field of Classification Search
CPC .............. H01L 29/04; H01L 21/02565; H01L 21/02587; H01L 29/7869; H01L 21/02554
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

CN    103124805 A    5/2013
EP    1737044 A    12/2006
(Continued)

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
(Continued)

*Primary Examiner* — Tucker J Wright
(74) *Attorney, Agent, or Firm* — Robinson Intellestual Property Law Offices; Eric J. Robinson

(57) ABSTRACT

To provide a crystalline oxide semiconductor film, an ion is made to collide with a target including a crystalline In—Ga—Zn oxide, thereby separating a flat-plate-like In—Ga—Zn oxide in which a first layer including a gallium atom, a zinc atom, and an oxygen atom, a second layer including an indium atom and an oxygen atom, and a third layer including a gallium atom, a zinc atom, and an oxygen atom are stacked in this order; and the flat-plate-like In—Ga—Zn oxide is irregularly deposited over a substrate while the crystallinity is maintained.

18 Claims, 25 Drawing Sheets

(51) Int. Cl.
*H01L 29/04* (2006.01)
*H01L 29/24* (2006.01)
*H01L 29/66* (2006.01)
*H01L 27/11558* (2017.01)
*C01G 15/00* (2006.01)

(52) U.S. Cl.
CPC .. *H01L 21/02587* (2013.01); *H01L 27/11558* (2013.01); *H01L 29/04* (2013.01); *H01L 29/045* (2013.01); *H01L 29/24* (2013.01); *H01L 29/66969* (2013.01); *C01P 2002/77* (2013.01); *C01P 2002/78* (2013.01); *C01P 2004/24* (2013.01); *C01P 2006/10* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,935,964 B2 | 5/2011 | Kim et al. |
| 7,998,372 B2 | 8/2011 | Yano et al. |
| 8,168,544 B2 | 5/2012 | Chang |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,343,799 B2 | 1/2013 | Ito et al. |
| 8,748,886 B2 | 6/2014 | Yamazaki et al. |
| 8,889,477 B2 | 11/2014 | Yamazaki et al. |
| 9,382,611 B2 | 7/2016 | Yamazaki et al. |
| 2001/0046027 A1 | 11/2001 | Tai et al. |
| 2002/0000593 A1 | 1/2002 | Nishiyama et al. |
| 2002/0028541 A1 | 3/2002 | Lee et al. |
| 2002/0056838 A1 | 5/2002 | Ogawa |
| 2002/0132454 A1 | 9/2002 | Ohtsu et al. |
| 2003/0006373 A1 | 1/2003 | Koguchi et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0067659 A1 | 4/2004 | Black et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0154561 A1 | 7/2007 | Takeda et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0008908 A1 | 1/2008 | Ishiwata et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0180544 A1 | 7/2008 | Drader et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0008638 A1 | 1/2009 | Kang et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0051938 A1* | 3/2010 | Hayashi ............ H01L 29/78663 257/43 |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0108502 A1 | 5/2010 | Inoue et al. |
| 2010/0109002 A1 | 5/2010 | Itagaki et al. |
| 2010/0117075 A1 | 5/2010 | Akimoto et al. |
| 2010/0123136 A1 | 5/2010 | Lee et al. |
| 2010/0133091 A1 | 6/2010 | Nishio et al. |
| 2010/0193782 A1 | 8/2010 | Sakata |
| 2010/0301329 A1 | 12/2010 | Asano et al. |
| 2011/0062433 A1 | 3/2011 | Yamazaki |
| 2011/0062436 A1 | 3/2011 | Yamazaki et al. |
| 2011/0117698 A1 | 5/2011 | Suzawa et al. |

(56) References Cited

U.S. PATENT DOCUMENTS

| | | |
|---|---|---|
| 2012/0037901 A1 | 2/2012 | Mori et al. |
| 2012/0064703 A1 | 3/2012 | Jintyou et al. |
| 2012/0138922 A1 | 6/2012 | Yamazaki et al. |
| 2012/0184066 A1 | 7/2012 | Yano et al. |
| 2012/0211745 A1 | 8/2012 | Ueda et al. |
| 2012/0267624 A1 | 10/2012 | Isobe et al. |
| 2012/0276694 A1 | 11/2012 | Koezuka et al. |
| 2012/0325650 A1 | 12/2012 | Yamazaki et al. |
| 2013/0009220 A1 | 1/2013 | Yamazaki et al. |
| 2013/0075723 A1 | 3/2013 | Yamazaki et al. |
| 2013/0082337 A1 | 4/2013 | Chudzik et al. |
| 2013/0087782 A1 | 4/2013 | Yamazaki et al. |
| 2013/0092924 A1 | 4/2013 | Sasagawa et al. |
| 2013/0092929 A1 | 4/2013 | Okazaki et al. |
| 2013/0099229 A1 | 4/2013 | Wakana et al. |
| 2013/0214273 A1 | 8/2013 | Yamazaki et al. |
| 2013/0221351 A1 | 8/2013 | Ebata et al. |
| 2013/0298989 A1 | 11/2013 | Tomizawa et al. |
| 2013/0341180 A1 | 12/2013 | Yamazaki |
| 2014/0001032 A1 | 1/2014 | Yamazaki |
| 2014/0021036 A1 | 1/2014 | Yamazaki |
| 2014/0042014 A1 | 2/2014 | Yamazaki |
| 2014/0045299 A1 | 2/2014 | Yamazaki |
| 2014/0102877 A1 | 4/2014 | Yamazaki |
| 2014/0103339 A1 | 4/2014 | Yamazaki et al. |
| 2014/0124776 A1 | 5/2014 | Takahashi et al. |
| 2014/0145183 A1 | 5/2014 | Yamazaki |
| 2014/0151687 A1 | 6/2014 | Yamazaki |
| 2014/0175435 A1 | 6/2014 | Yamazaki et al. |
| 2014/0183527 A1 | 7/2014 | Yamazaki et al. |
| 2014/0183530 A1 | 7/2014 | Yamazaki et al. |
| 2014/0203276 A1 | 7/2014 | Yamazaki et al. |
| 2014/0225104 A1 | 8/2014 | Yamazaki et al. |
| 2014/0284596 A1 | 9/2014 | Yamazaki et al. |
| 2014/0306219 A1 | 10/2014 | Yamazaki et al. |
| 2014/0333864 A1 | 11/2014 | Miyake et al. |
| 2014/0346500 A1 | 11/2014 | Yamazaki |
| 2015/0021593 A1 | 1/2015 | Yamazaki |
| 2017/0016108 A1 | 1/2017 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| JP | 2006-261483 A | 9/2006 |
| JP | 2010-058135 A | 3/2010 |
| JP | 2012-144431 A | 8/2012 |
| JP | 2013-038401 A | 2/2013 |
| JP | 2013-093561 A | 5/2013 |
| JP | 2013-102141 A | 5/2013 |
| JP | 2013-102145 A | 5/2013 |
| KR | 2013-0040135 A | 4/2013 |
| TW | 201310644 | 3/2013 |
| WO | WO-2004/114391 | 12/2004 |
| WO | WO-2007/058231 | 5/2007 |
| WO | WO-2012/169449 | 12/2012 |
| WO | WO-2013/054823 | 4/2013 |

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Yamazaki.S et al., "Research, Development, and Application of Crystalline Oxide Semiconductor", SID Digest '12 : SID International Symposium Digest of Technical Papers, Jun. 5, 2012, pp. 183-186.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters ) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

(56) References Cited

OTHER PUBLICATIONS

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics ) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters ) , Sep. 13, 2004, vol. 85, No. 11, pp. 1993-1995.

Nomura.K et al., "Room-Temperature Fabrication of Transparent Flexible Thin-Film Transistors Using Amorphous Oxise Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters ) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C. "Hydrogen as a Cause of Doping in Zinc Oxide", Phys. Rev. Lett. (Physical Review Letters), Jul. 31, 2000, vol. 85, No. 5, pp. 1012-1015.

Yamazaki.S et al., "Properties of crystalline In—Ga—Zn-oxide semiconductor and its transistor characteristics", Jpn. J. Appl. Phys. (Japanese Journal of Applied Physics), Apr. 1, 2014, vol. 53, No. 4, pp. 04ED18-1-04ED18-10.

International Search Report (Application No. PCT/JP2014/066367) Dated Sep. 22, 2014.

Written Opinion (Application No. PCT/JP2014/066367) Dated Sep. 22, 2014.

Matteucci.G et al., "An experiment on the particle-wave nature of electrons", Eur. J. Phys (European Journal of Physics), 2009, vol. 30, pp. 217-226.

Chinese Office Action (Application No. 201480035052.0) Dated Apr. 27, 2017.

\* cited by examiner

InGaZnO₄

InGaZnO₄

Position where Ar or O enters

In : ○   Ga : ○   Zn : ●   O : ●

FIG. 5A
FIG. 5B
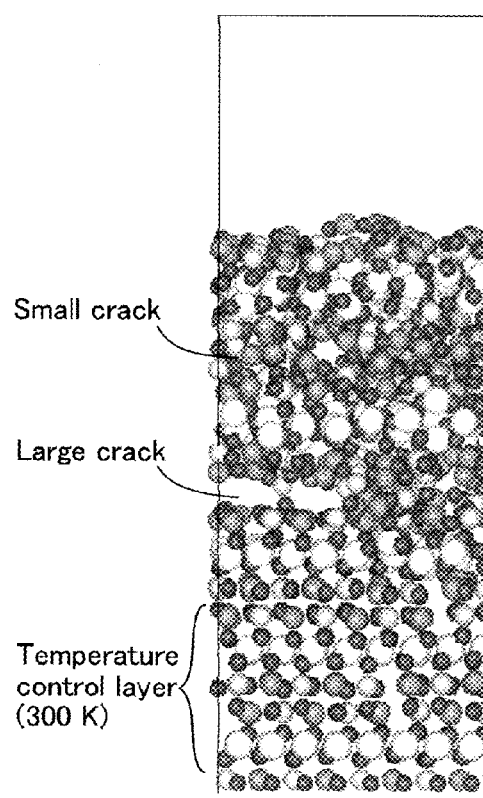
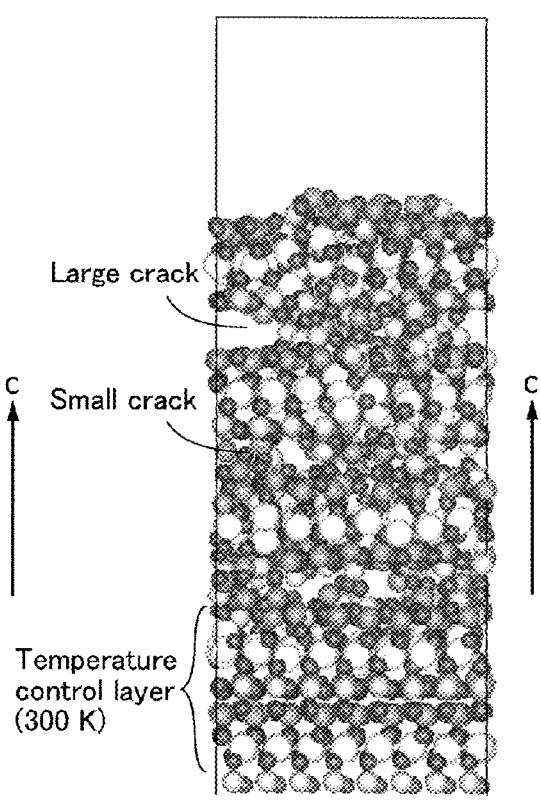
In: ○   Ga: ○   Zn: ●   O: ●

3 nm

2nm

FIG. 10
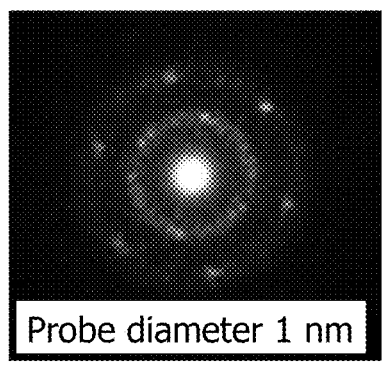
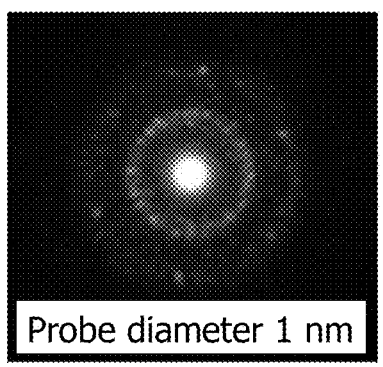
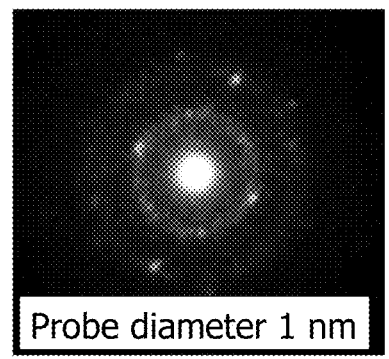
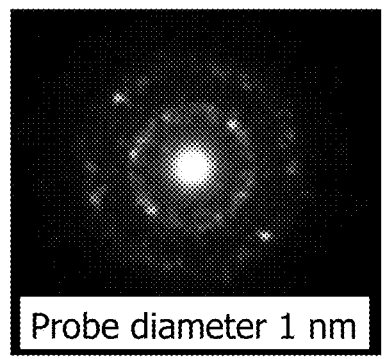

FIG. 14
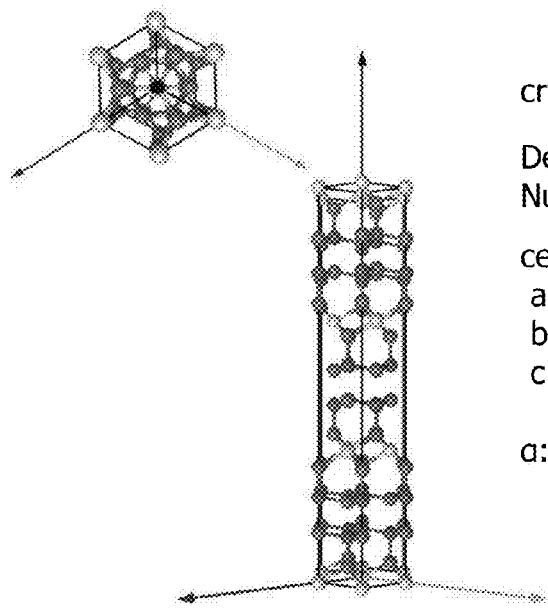
crystalline InGaZnO$_4$
Density: 6.4 g/cm$^3$
Number of total atoms: 166
cell length
 a : 0.3295 nm
 b : 0.3295 nm
 c : 2.607 nm
α: 90°  β: 90°  γ: 120°
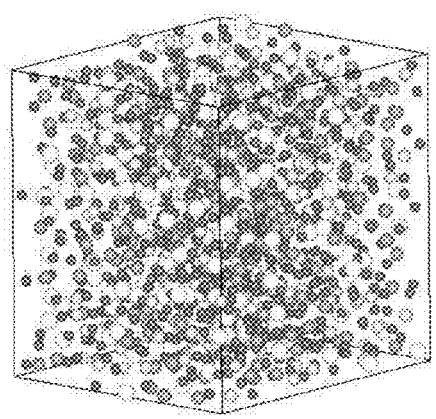
amorphous InGaZnO$_4$
Density: 6.1 g/cm$^3$
Number of total atoms: 1344
cell length
 a : 2.67577 nm
 b : 2.31729 nm
 c : 2.64627 nm
α: 90°  β: 90°  γ: 90°

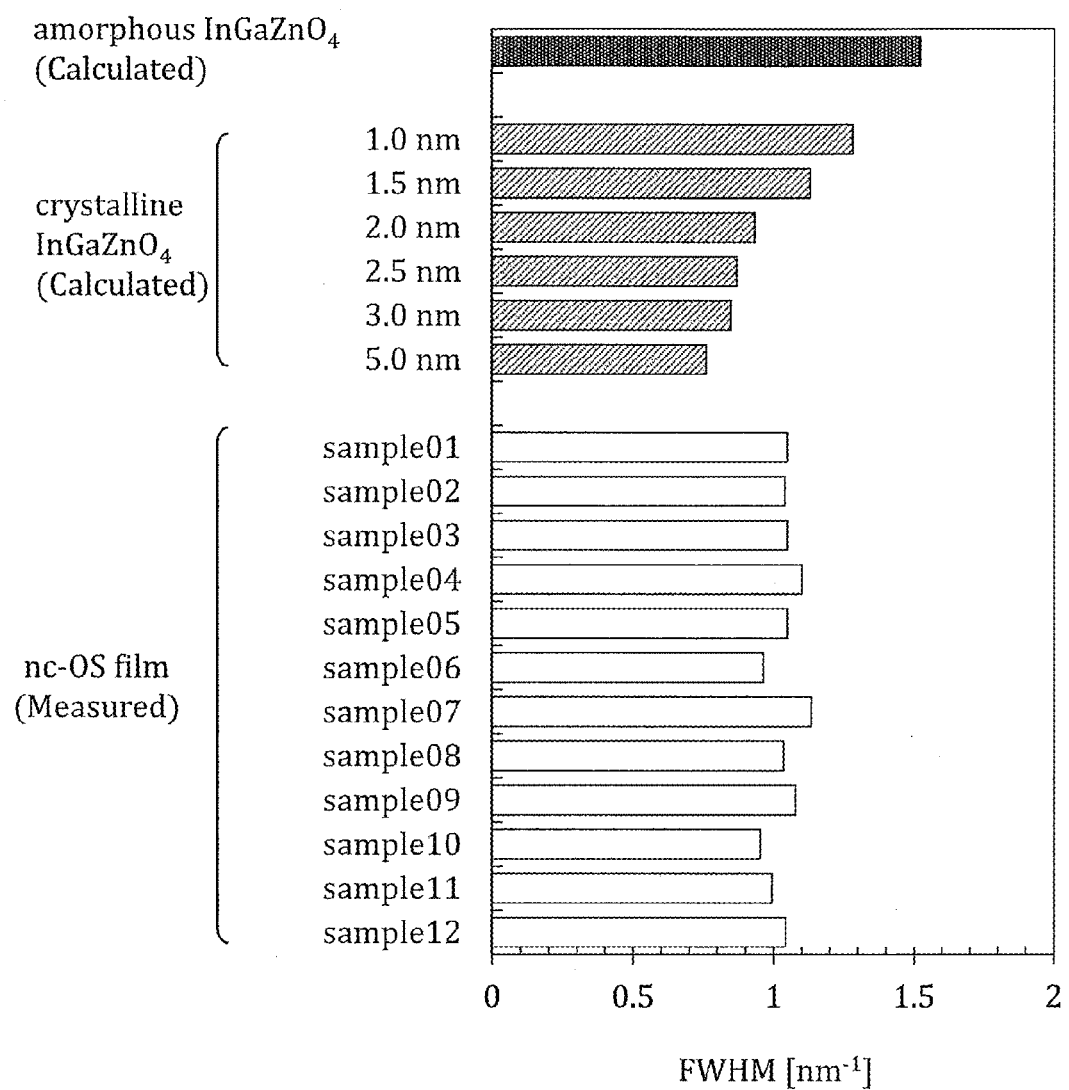

FIG. 18A
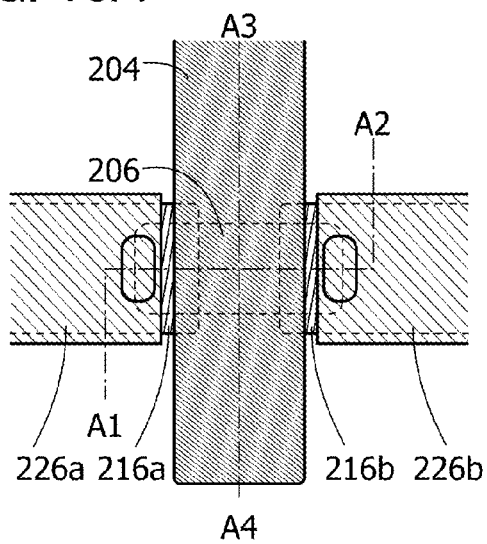
FIG. 18C
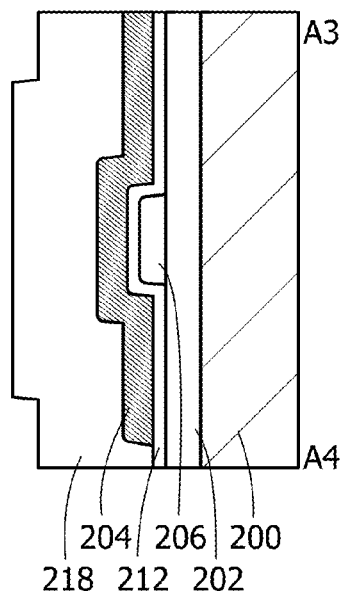
FIG. 18B1
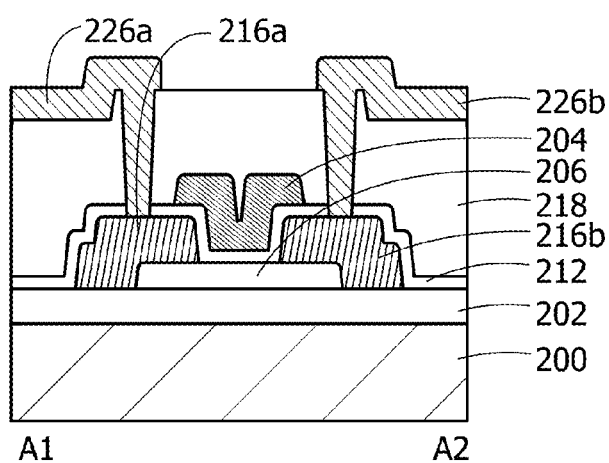
FIG. 18B2
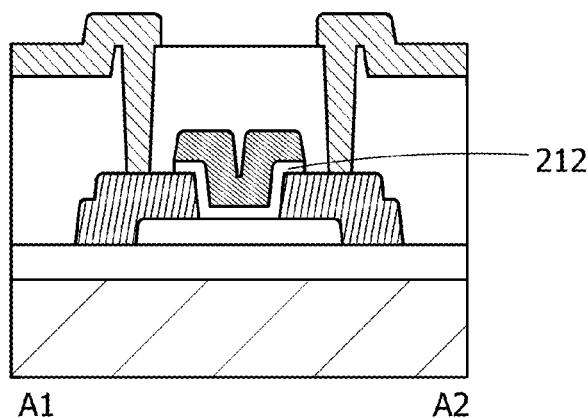

OXIDE SEMICONDUCTOR FILM

TECHNICAL FIELD

The present invention relates to an object, a method, or a manufacturing method. In addition, the present invention relates to a process, a machine, manufacture, or a composition of matter. In particular, the present invention relates to, for example, a semiconductor film, a semiconductor device, a display device, a liquid crystal display device, or a light-emitting device. Furthermore, the present invention relates to a manufacturing method of a semiconductor film, a semiconductor device, a display device, a liquid crystal display device, or a light-emitting device. Alternatively, the present invention relates to a driving method of a semiconductor device, a display device, a liquid crystal display device, or a light-emitting device.

Note that in this specification, a semiconductor device refers to any device that can function by utilizing semiconductor characteristics. An electro-optical device, a display device, a memory device, a semiconductor circuit, an electronic device, and the like are included in or include a semiconductor device in some cases.

BACKGROUND ART

A technique by which a transistor is formed using a semiconductor film formed over a substrate having an insulating surface has been attracting attention. The transistor is applied to a wide range of semiconductor devices such as an integrated circuit and a display device. A silicon film is known as a semiconductor film applicable to a transistor.

As the silicon film used as a semiconductor film of a transistor, either an amorphous silicon film or a polycrystalline silicon film is used depending on the purpose. For example, in the case of a transistor included in a large-sized display device, it is preferable to use an amorphous silicon film, which can be formed using the established technique for forming a film on a large-sized substrate. On the other hand, in the case of a transistor included in a high-performance display device where driver circuits are formed over the same substrate, it is preferable to use a polycrystalline silicon film, which can form a transistor having a high field-effect mobility. As a method for forming a polycrystalline silicon film, high-temperature heat treatment or laser light treatment which is performed on an amorphous silicon film has been known.

In recent years, an oxide semiconductor film has attracted attention. For example, a transistor including an amorphous In—Ga—Zn oxide film is disclosed (see Patent Document 1). An oxide semiconductor film can be formed by a sputtering method or the like, and thus can be used for a semiconductor film of a transistor in a large-sized display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

In 1985, synthesis of an In—Ga—Zn oxide crystal was reported (see Non-Patent Document 1). Furthermore, it has been reported that an In—Ga—Zn oxide has a homologous structure and is represented by a composition formula $InGaO_3(ZnO)_m$ (m is a natural number) (see Non-Patent Document 2).

It has been reported that a transistor including a crystalline In—Ga—Zn oxide film has more excellent electrical characteristics and higher reliability than a transistor including an amorphous In—Ga—Zn oxide film (see Non-Patent Document 3). Non-Patent Document 3 reports that a grain boundary is not clearly observed in an In—Ga—Zn oxide film including a c-axis aligned crystal (CAAC).

REFERENCE

Patent Document

[Patent Document 1] Japanese Published Patent Application No. 2006-165528

Non-Patent Document

[Non-Patent Document 1] N. Kimizuka, and T. Mohri, *J. Solid State Chem.*, Vol. 60, 1985, p. 382-384

[Non-Patent Document 2] N. Kimizuka, M. Isobe, and M. Nakamura: *J. Solid State Chem.*, 1995, Vol. 116, p. 170

[Non-Patent Document 3] S. Yamazaki, J. Koyama, Y. Yamamoto, and K. Okamoto: *SID* 2012 *DIGEST*, p. 183-186

DISCLOSURE OF INVENTION

An object of the present invention is to provide a crystalline oxide semiconductor film. Another object of the present invention is to provide a method for forming a crystalline oxide semiconductor film.

Another object of the present invention is to provide a sputtering target which enables the oxide semiconductor film to be formed.

Another object of the present invention is to provide a method for using the sputtering target.

Another object of the present invention is to provide a transistor which includes the oxide semiconductor film and has stable electrical characteristics.

Another object of the present invention is to provide a highly reliable semiconductor device including the transistor.

Another object of the present invention is to provide a semiconductor device having a low off-state current. Alternatively, another object of the present invention is to provide a semiconductor device which consumes low power. Another object of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

An oxide semiconductor film of one embodiment of the present invention is, for example, an oxide semiconductor film over a substrate. The oxide semiconductor film includes a plurality of flat-plate-like crystalline In—Ga—Zn oxides. The plurality of flat-plate-like crystalline In—Ga—Zn oxides are arranged to face in random directions. In the oxide semiconductor film, a grain boundary is not observed with a transmission electron microscope.

For example, an equivalent circle diameter of the flat plane of the plurality of flat-plate-like crystalline In—Ga—Zn oxides is preferably greater than or equal to 1 nm and less than or equal to 3 nm. For example, a thickness of the plurality of flat-plate-like crystalline In—Ga—Zn oxides is preferably greater than or equal to 0.5 nm and less than or equal to 0.9 nm.

Another embodiment of the present invention is a method for forming an oxide semiconductor film including the steps of: making an ion collide with a target including a crystalline In—Ga—Zn oxide, thereby separating a flat-plate-like In—Ga—Zn oxide in which a first layer including a gallium atom, a zinc atom, and an oxygen atom, a second layer including an indium atom and an oxygen atom, and a third layer including a gallium atom, a zinc atom, and an oxygen atom are stacked in this order; and irregularly depositing the flat-plate-like In—Ga—Zn oxide over a substrate while maintaining the crystallinity.

For example, the composition formula of the crystalline In—Ga—Zn oxide included in the target is preferably $InGaZnO_4$.

For example, the ion is preferably an oxygen cation.

Another embodiment of the present invention is a transistor including the above-described oxide semiconductor film. Another embodiment of the present invention is a semiconductor device including the transistor.

A crystalline oxide semiconductor film can be provided.

Alternatively, a sputtering target which enables the oxide semiconductor film to be formed can be provided.

A transistor which includes the oxide semiconductor film and has stable electrical characteristics can be provided.

A highly reliable semiconductor device including the transistor can be provided.

A semiconductor device having a low off-state current can be provided. Alternatively, a semiconductor device which consumes low power can be provided. Further alternatively, a novel semiconductor device can be provided.

BRIEF DESCRIPTION OF DRAWINGS

FIGS. 4A and 4B show a structure of $InGaZnO_4$ before collision of an atom, and the like.

FIGS. 5A and 5B show a structure of $InGaZnO_4$ after collision of an atom, and the like.

FIG. 10 shows nanobeam electron diffraction patterns of an nc-OS film thinned to several nanometers.

FIG. 14 shows structural models used for calculation.

FIG. 17 shows a full width half maximum (FWHM) of a first peak.

FIGS. 18A, 18B1, 18B2, and 18C are top views and cross-sectional views illustrating an example of a transistor of one embodiment of the present invention.

BEST MODE FOR CARRYING OUT THE INVENTION

Figure 1:
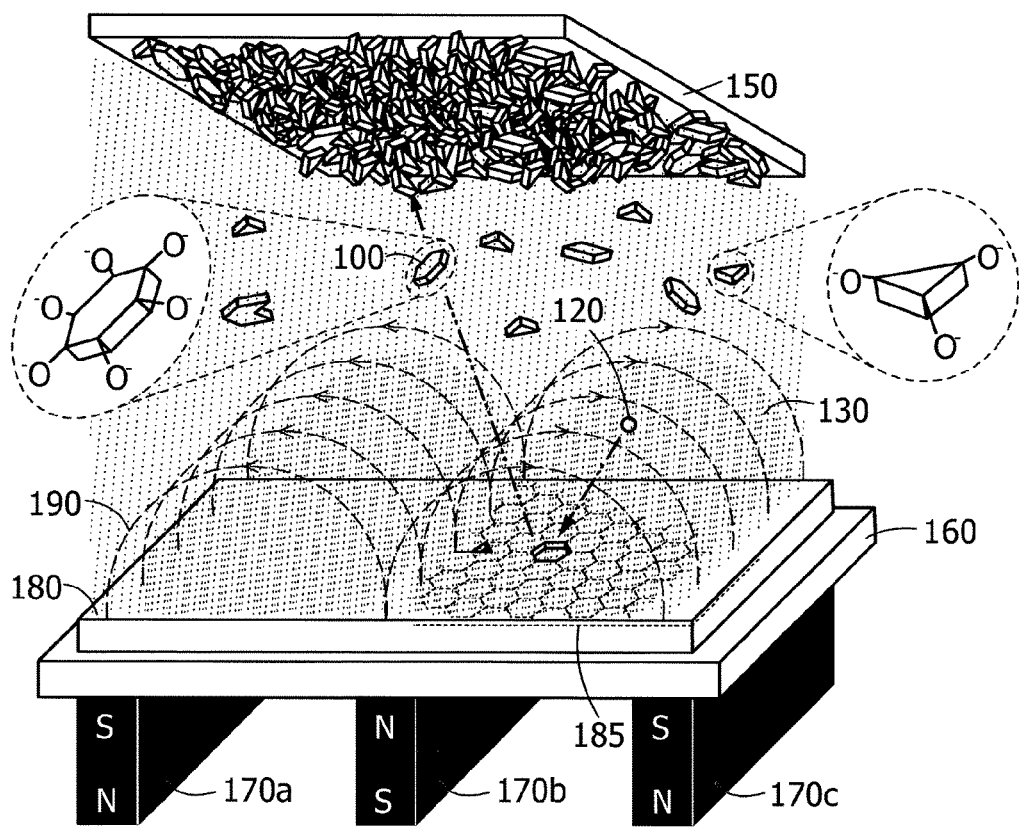
FIG. 1 is a model diagram illustrating a deposition method of an oxide semiconductor film of one embodiment of the present invention.

Embodiments of the present invention will be described in detail below with reference to the accompanying drawings. However, the present invention is not limited to the description below, and it is easily understood by those skilled in the art that modes and details disclosed herein can be modified in various ways. Furthermore, the present invention is not construed as being limited to description of the following embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams is sometimes exaggerated for simplicity.

A voltage usually refers to a potential difference between a given potential and a reference potential (e.g., a source potential or a ground potential (GND)). A voltage can be referred to as a potential and vice versa.

Note that ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Moreover, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Note that an impurity in a semiconductor layer refers to, for example, elements other than the main components of a semiconductor layer. For example, an element with a concentration lower than 0.1 atomic % is an impurity. When an impurity is contained, the density of states (DOS) in a semiconductor layer may be increased, the carrier mobility may be decreased, or the crystallinity may be decreased, for example. In the case where the semiconductor layer is an oxide semiconductor layer, examples of an impurity which changes characteristics of the semiconductor layer include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. When the semiconductor layer is an oxide semiconductor layer, oxygen vacancies may be formed by entry of impurities such as hydrogen, for example. Moreover, when the semiconductor layer is a silicon layer, examples of an impurity which changes the characteristics of the semiconductor layer include oxygen, Group 1 elements except hydrogen, Group 2 elements, Group 13 elements, and Group 15 elements.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

In this specification, the trigonal and rhombohedral crystal systems are included in the hexagonal crystal system.

<Structure of Oxide Semiconductor Film>

A structure of an oxide semiconductor film which can be used as a semiconductor film of a transistor is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. For example, in some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. An electric charge trapped by the carrier traps in the oxide semiconductor film takes a long time to be released, and might behave like a fixed electric charge. Thus, the transistor which includes the oxide semiconductor film having a high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In an image of a polycrystalline oxide semiconductor film which is obtained with a TEM, crystal grains can be found. Moreover, in an image of the polycrystalline oxide semiconductor film which is obtained with the TEM, a boundary between crystal grains can be found in some cases.

The polycrystalline oxide semiconductor film has high crystallinity and thus has a high electron mobility in some cases. Accordingly, a transistor including the polycrystalline oxide semiconductor film has a high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has in some cases larger variation in electrical characteristics and lower reliability than a transistor including a CAAC-OS film.

Next, a microcrystalline oxide semiconductor film is described.

In an image of the microcrystalline oxide semiconductor film which is obtained with the TEM, crystal parts cannot be found clearly in some cases. In most cases, the size of a crystal part in the microcrystalline oxide semiconductor film is greater than or equal to 1 nm and less than or equal to 100 nm or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a crystal grain cannot be found clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than a diameter of a crystal part. Meanwhile, spots are observed in a nanobeam electron diffraction pattern of the nc-OS film obtained by using an electron beam having a probe diameter (e.g., larger than or equal to 1 nm and smaller than or equal to 30 nm) close to, or smaller than or equal to a diameter of a crystal part. Furthermore, in a nanobeam electron diffraction pattern of the nc-OS film, regions with high luminance are shown in a circular (ring) pattern in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Accordingly, the nc-OS film has a higher carrier density than the CAAC-OS film in some cases. An oxide semiconductor film with a high carrier density tends to have a high electron mobility. Therefore, a transistor including the nc-OS film has a high field-effect mobility in some cases.

On the other hand, the transistor including the nc-OS film has smaller variation in electrical characteristics and higher reliability than a transistor including an amorphous oxide semiconductor film. The nc-OS film can be formed easily as compared to the CAAC-OS film because the nc-OS film can be obtained even when the amount of impurity contained therein is relatively large; thus, the nc-OS film is preferably used depending on the application in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image of the polycrystalline oxide semiconductor film which is obtained with a TEM, crystal parts cannot be found.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Thus, the amorphous oxide semiconductor film has a much higher carrier density than the nc-OS film in some cases. Therefore, a transistor including the amorphous oxide semiconductor film tends to be normally on, and in some cases, can be preferably used for a transistor which needs to have such electrical characteristics. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

As described above, an oxide semiconductor film can have various structures. Each structure has an advantage; therefore, in accordance with usage, an oxide semiconductor film having an optimal structure is preferably used.

<Deposition Model of Nc-OS Film>

An nc-OS film that is a crystalline oxide semiconductor film of one embodiment of the present invention is described below.

The nc-OS film can be deposited using a cleavage plane in a crystal. A deposition model of the nc-OS film using a sputtering method is described below.

FIG. 1 is a schematic diagram of a deposition chamber illustrating a state where the nc-OS film is formed by a sputtering method.

A target 180 is attached to a backing plate 160. Under the target 180 and the backing plate 160, a magnet 170a, a magnet 170b, and a magnet 170c are placed. The magnet 170a, the magnet 170b, and the magnet 170c generate a magnetic field represented by magnetic force lines 190 over the target 180. Although the magnet 170a and the magnet 170c each have an S pole on the backing plate 160 side and the magnet 170b has an N pole on the backing plate 160 side, one embodiment of the present invention is not limited thereto. For example, the magnet 170a and the magnet 170c each may have an N pole on the backing plate 160 side and the magnet 170b may have an S pole on the backing plate 160 side.

The target 180 has a cleavage plane 185. Although the target 180 has a plurality of cleavage planes 185, only one cleavage plane is shown here for easy understanding.

A substrate 150 is placed to face the target 180. The deposition chamber is mostly filled with a deposition gas (e.g., an oxygen gas, an argon gas, or a mixed gas containing oxygen at 50 vol % or higher) and controlled to a low pressure (approximately 0.1 Pa to 10 Pa). Here, discharge starts by application of a voltage at a constant value or higher to the target 180, and plasma is observed. Note that the magnetic field over the target 180 makes a region 130 to be a high-density plasma region. In the region 130, the deposition gas is ionized, so that an ion 120 is formed. Examples of the ion 120 include an oxygen cation ($O^+$) and an argon cation ($Ar^+$).

The ion 120 is accelerated to the target 180 side by an electric field, and collides with the target 180 eventually. At this time, a pellet 100 which is a flat-plate-like (pellet-like) sputtered particle is separated and sputtered from the cleavage plane 185.

The shape of a flat plane of the pellet 100 may be a triangle (regular triangle) or a shape formed of two to six triangles. For example, a square (rhombus) is formed by combining two triangles (regular triangles), and a hexagon (regular hexagon) is formed by combining six triangles (regular triangles). FIG. 1 illustrates examples of the pellets 100 having a regular triangular flat plane, a rhombus flat plane, a flat plane formed of two rhombuses, and a regular hexagonal flat plane as typical flat-plane shapes of the pellet 100.

The pellet 100 receives an electric charge from plasma when passing through the region 130, so that end portions thereof are negatively or positively charged in some cases. FIG. 1 also illustrates an enlarged view showing the case where the flat plane of the pellet 100 is a regular hexagon and an enlarged view showing the case where the flat plane of the pellet 100 is a regular triangle. As illustrated in the enlarged views, the end portions of the pellet 100 are terminated with oxygen and there is a possibility that the oxygen is negatively charged. The end portions of the pellet 100 are charged in the same polarity, so that electric charges repel each other; thus, the pellet 100 can maintain a flat-plate shape.

An assumed example of the movement of the sputtered pellet 100 until the sputtered pellet 100 reaches the substrate 150 is described. For example, the pellet 100 flies linearly in plasma. By stacking the pellets 100 over the substrate 150, an nc-OS film can be obtained. Migration of the pellets 100 hardly occurs and the pellets 100 are deposited over the substrate 150 to face in random directions. Therefore, the nc-OS film becomes an oxide semiconductor film having crystallinity and no alignment.

In this manner, laser crystallization is not needed for forming the nc-OS film; therefore, a uniform film can be deposited even over a large sized glass substrate or the like.

Note that when the ion 120 collides with the target 180, there is a possibility that in addition to the pellet 100, an atom included in the target is sputtered; however, the mass of an atom is extremely lower than that of the pellet 100 and thus, it is considered that the atoms are mostly evacuated to the outside of the deposition chamber by a vacuum pump.

Note that the target 180 preferably contains a certain amount or more of indium. As described above, the pellet 100 has the shape in which an In—O layer is sandwiched between Ga—Zn—O layers or the like. In other words, the In—O layer serves as a core of the pellet 100. Accordingly, in the case where there is no In—O layer, the pellet 100 is difficult to maintain its shape and thus might become a deposition particle (deposition dust). For example, the proportion of indium contained in the entire target 180 is 1 atomic % or higher, preferably 2 atomic % or higher, further preferably 5 atomic % or higher, still further preferably 10 atomic % or higher.

In the case where the nc-OS film is used as a semiconductor film of a transistor and for example, the target 180 having the atomic ratio of metal elements of In:Ga:Zn=$x_1$:$y_1$:$z_1$ is used, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, an nc-OS film is easily formed. Examples of the atomic ratio of the metal elements included in the target are In:Ga:Zn=1:1:1, In:Ga:Zn=3:1:2, and In:Ga:Zn=5:5:6.

Alternatively, in the case where the nc-OS film is used as an oxide semiconductor film which protects a semiconductor film of a transistor and the target 180 having the atomic ratio of metal elements of In:Ga:Zn=$x_2$:$y_2$:$z_2$ is used, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, an nc-OS film is easily formed. Examples of the atomic ratio of the metal elements included in the target are In:Ga:Zn=1:3:2, In:Ga:Zn=1:3:3, In:Ga:Zn=1:3:4, In:Ga:Zn=1:3:6, In:Ga:Zn=1:3:8, and In:Ga:Zn=1:6:4.

The target 180 preferably has high crystallinity.

According to the deposition model described above, the nc-OS film can be obtained.

<Generation of Pellet>

A method for separating a pellet from a target having high crystallinity is described below.

Figure 2:
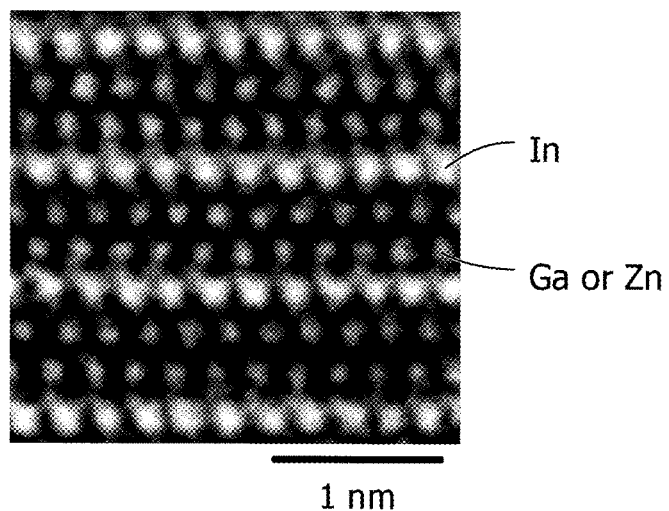
FIG. 2 shows a cross-sectional HAADF-STEM image of a target of one embodiment of the present invention.

FIG. 2 shows atomic arrangement in a cross section of a crystalline In—Ga—Zn oxide target. For observation of the atomic arrangement, a high-angle annular dark field scanning transmission electron microscopy (HAADF-STEM) was used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 was used for the HAADF-STEM.

FIG. 2 indicates that the target has a layered atomic arrangement.

Figure 3A:
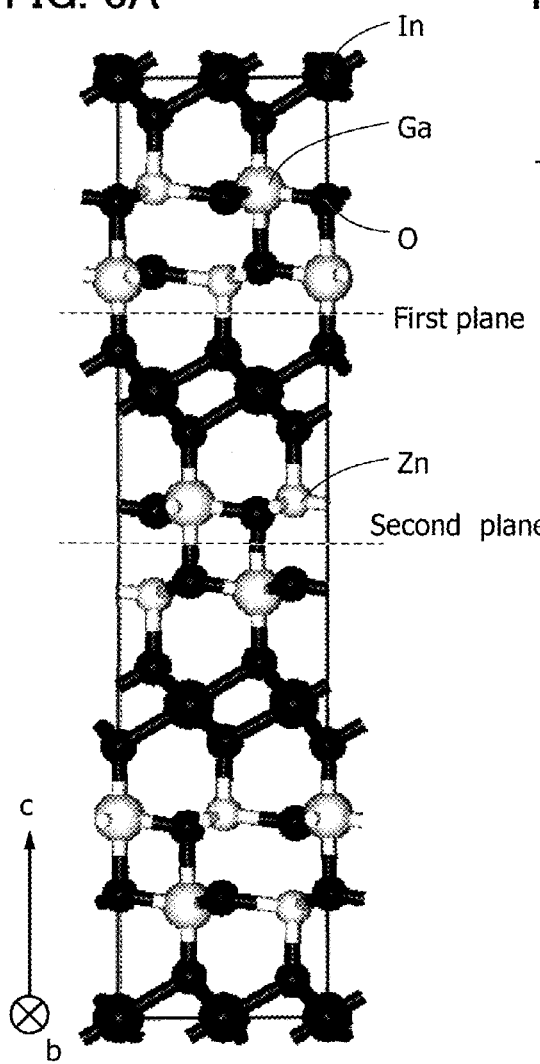
FIGS. 3A and 3B show an $InGaZnO_4$ crystal.
Figure 3B:
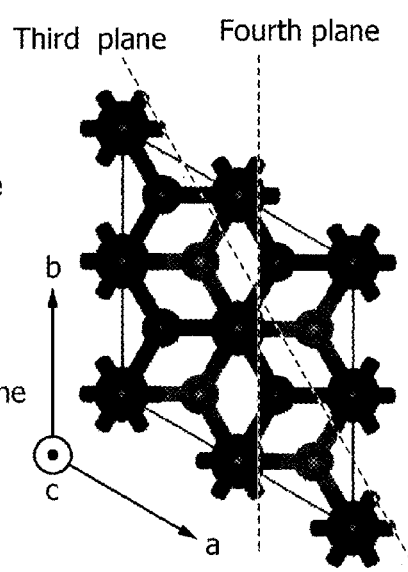

First, a cleavage plane of the target is described with reference to FIGS. 3A and 3B. FIGS. 3A and 3B show a structure of an InGaZnO$_4$ crystal included in the target. Note that FIG. 3A shows a structure of the case where the InGaZnO$_4$ crystal is observed from a direction parallel to the b-axis when the c-axis is in an upward direction. Furthermore, FIG. 3B shows a structure of the case where the InGaZnO$_4$ crystal is observed from a direction parallel to the c-axis.

Energy needed for cleavage at each of crystal planes of the InGaZnO$_4$ crystal was calculated by the first principles calculation. Note that a pseudopotential and density functional theory program (CASTEP) using the plane wave basis were used for the calculation. Note that an ultrasoft type pseudopotential was used as the pseudopotential. As the functional, GGA/PBE was used. Cut-off energy was 400 eV.

Energy of a structure in an initial state was obtained after structural optimization including a cell size was performed. Furthermore, energy of a structure after the cleavage at each plane was obtained after structural optimization of atomic arrangement was performed in a state where the cell size was fixed.

On the basis of the structure of the InGaZnO$_4$ crystal shown in FIGS. 3A and 3B, a structure cleaved at any one of the first plane, the second plane, the third plane, and the fourth plane was formed and subjected to structural optimization calculation in which the cell size was fixed. Here, the first plane is a crystal plane between Ga—Zn—O layers and an In—O layer and is parallel to the (001) plane (or the a-b plane) (see FIG. 3A). The second plane is a crystal plane between a Ga—Zn—O layer and a Ga—Zn—O layer and is parallel to the (001) plane (or the a-b plane) (see FIG. 3A). The third plane is a crystal plane parallel to the (110) plane (see FIG. 3B). The fourth plane is a crystal plane parallel to the (100) plane (or the b-c plane) (see FIG. 3B).

Under the above conditions, the energy of the structure at each plane after the cleavage was calculated. Next, a difference between the energy of the structure after the cleavage and the energy of the structure in the initial state was divided by the area of the cleavage plane; thus, cleavage energy which served as a measure of easiness of cleavage at each plane was calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane was 2.60 J/m$^2$, that of the second plane was 0.68 J/m$^2$, that of the third plane was 2.18 J/m$^2$, and that of the fourth plane was 2.12 J/m$^2$ (see Table 1).

TABLE 1

| | Cleavage Energy [J/m$^2$] |
|---|---|
| First Plane | 2.60 |
| Second Plane | 0.68 |
| Third Plane | 2.18 |
| Fourth Plane | 2.12 |

From the calculations, in the structure of the InGaZnO$_4$ crystal shown in FIGS. 3A and 3B, the cleavage energy at the second plane was the lowest. In other words, a plane between a Ga—Zn—O layer and a Ga—Zn—O layer was cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 3A can be separated at a plane equivalent to two second planes. Thus, the minimum unit of the InGaZnO$_4$ crystal is considered to be three layers of a Ga—Zn—O layer, an In—O layer, and a Ga—Zn—O layer. Separation occurs at two cleavage planes to obtain the pellet. Therefore, the pellet can also be called a cleavage unit.

Next, the shapes of particles which are sputtered by sputtering the target were calculated.

Figure 4A:
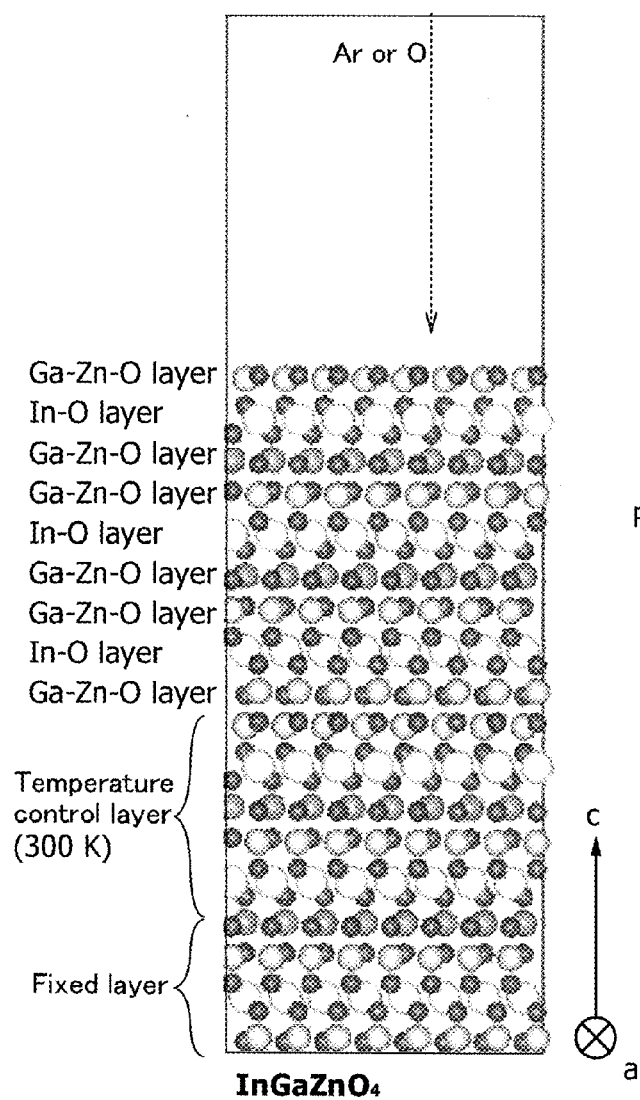
Figure 4B:
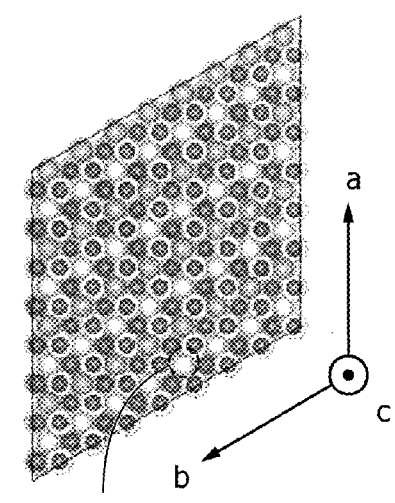

Here, through classical molecular dynamics calculation, on the assumption of an InGaZnO$_4$ crystal having a homologous structure as a target, a cleavage plane in the case where the target is sputtered using argon (Ar) or oxygen (O) was evaluated. FIG. 4A shows a cross-sectional structure of an InGaZnO$_4$ crystal (2688 atoms) used for the calculation, and FIG. 4B shows a top structure thereof. Note that a fixed layer in FIG. 4A is a layer which prevents the positions of the atoms from moving. A temperature control layer in FIG. 4A is a layer whose temperature is constantly set to a fixed temperature (300 K).

For the classical molecular dynamics calculation, Materials Explorer 5.0 manufactured by Fujitsu Limited was used. Note that the initial temperature, the cell size, the time step size, and the number of steps were set to be 300 K, a certain size, 0.01 femtosecond, and ten million, respectively. In calculation, an atom to which an energy of 300 eV was applied was made to enter a cell from a direction perpendicular to the a-b plane of the InGaZnO$_4$ crystal under the conditions.

FIG. 5A shows an atomic arrangement when 99.9 picoseconds have passed after argon enters the cell including the InGaZnO$_4$ crystal shown in FIGS. 4A and 4B. FIG. 5B shows an atomic arrangement when 99.9 picoseconds have passed after oxygen enters the cell. Note that in FIGS. 5A and 5B, part of the fixed layer in FIG. 4A is omitted.

According to FIG. 5A, in a period from entry of argon into the cell to the time when 99.9 picoseconds have passed, a crack was formed from the cleavage plane corresponding to the second plane shown in FIG. 3A. Thus, in the case where argon collides with the InGaZnO$_4$ crystal and the uppermost surface is the second plane (the zero-th), a large crack was found to be formed in the second plane (the second).

On the other hand, according to FIG. 5B, in a period from entry of oxygen into the cell to the time when 99.9 picoseconds have passed, a crack was found to be formed from the cleavage plane corresponding to the second plane shown in FIG. 3A. Note that in the case where oxygen collides with the cell, a large crack was found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a pellet is separated. It is also found that the pellet formed in the case where oxygen collides with the cell is smaller than that formed in the case where argon collides with the cell.

Therefore, this calculation also shows that the InGaZnO$_4$ crystal with which an atom (ion) collides is separated from the cleavage plane.

The above calculation shows that when a target including the InGaZnO$_4$ crystal having a homologous structure is sputtered, part of the target is separated from the cleavage plane to form a pellet. Therefore, as illustrated in FIG. 1, the oxide semiconductor film which is obtained by irregular deposition of the pellets becomes an oxide semiconductor film having crystallinity and no alignment.

Figure 6A:
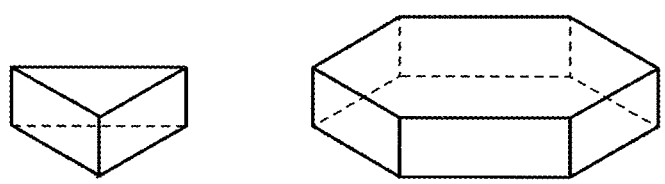
FIGS. 6A and 6B illustrate pellets.
Figure 6B:
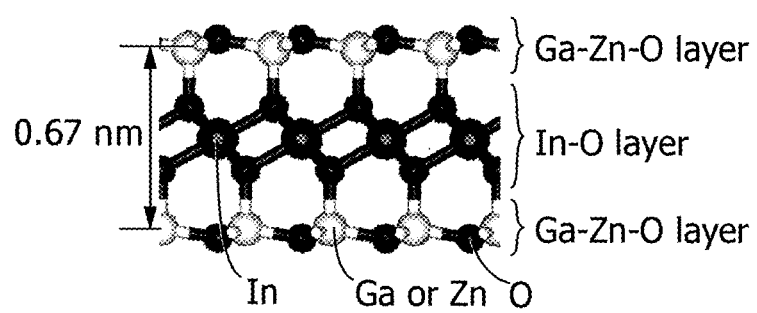

FIG. 6A shows a columnar pellet having a triangle flat surface and a columnar pellet having a hexagonal flat surface. The thickness of each pellet is expected to be approximately 0.67 nm from a position where a cleavage plane is formed (see FIG. 6B).

<Physical Properties of Nc-OS Film>

The physical properties of the nc-OS film deposited in the above manner are described below. Note that the case where the nc-OS film is an In—Ga—Zn oxide film is described.

Figure 7A:
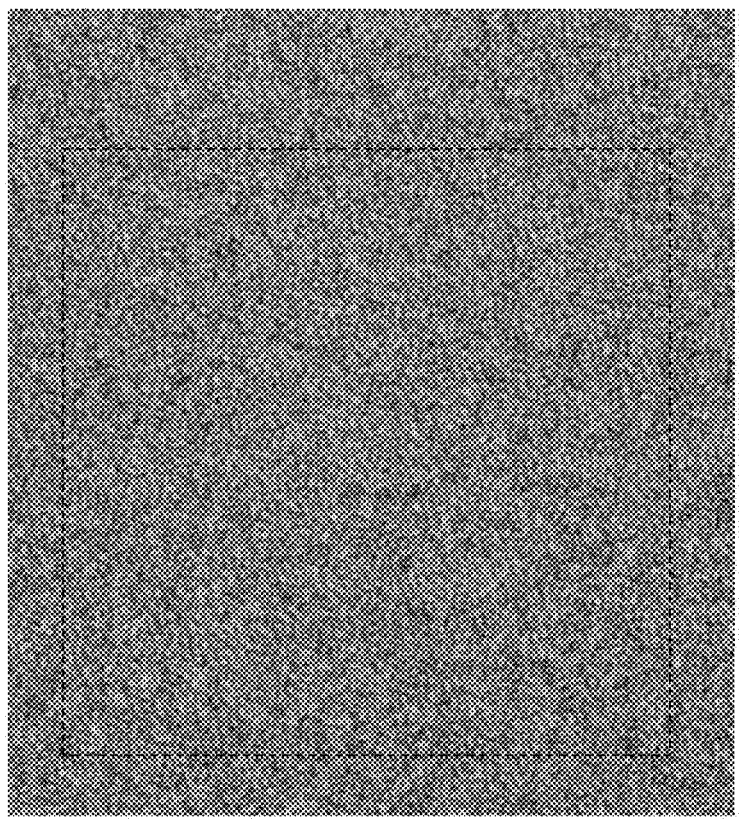
FIGS. 7A to 7C show a high-resolution planar TEM image of an nc-OS film, a Fourier transform image of the high-resolution planar TEM image, and a reverse Fourier transform image of the high-resolution planar TEM image.

FIG. 7A is a combined analysis image of a bright-field image obtained by a planar TEM observation and a diffraction pattern (the combined analysis image is also referred to as a high-resolution planar TEM image) of the nc-OS film. In some cases, the high-resolution planar TEM image does not show distinct crystallinity of the nc-OS film. The high-resolution planar TEM image was obtained using a Hitachi H-9000NAR transmission electron microscope at an accelerating voltage of 300 kV.

Figure 7B:
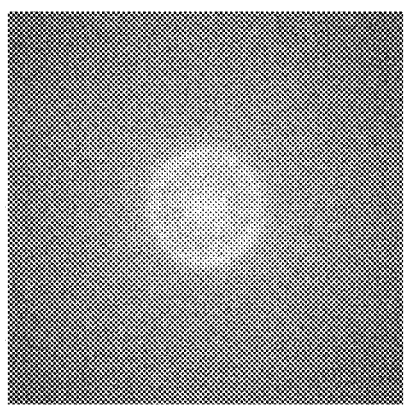

To evaluate periodicity of atomic arrangement, a portion surrounded by a dashed line in FIG. 7A was subjected to Fourier transform to obtain a Fourier transform image of the high-resolution planar TEM image (see FIG. 7B). The Fourier transform image of the high-resolution planar TEM image does not show distinct crystallinity either.

Figure 7C:
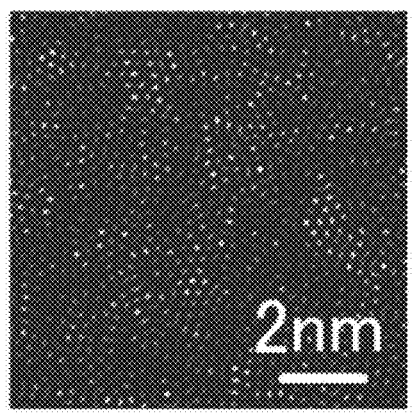

Next, to enhance the periodicity of the atomic arrangement, mask processing was performed on the Fourier transform image of the high-resolution planar TEM image so that only information of a region with high luminance remains, and then reverse Fourier transform was conducted to obtain a reverse Fourier transform image of the high-resolution planar TEM image (see FIG. 7C). As a result, the periodicity of the atomic arrangement was able to be observed in a small region with a size of approximately 1 nm to 3 nm. In other words, there is a possibility that a crystalline region with a size of approximately 1 nm to 3 nm exists in the nc-OS film.

The nc-OS film shown in FIGS. 7A to 7C was thinned to obtain Sample A with a thickness of approximately 50 nm, and then an electron diffraction pattern of Sample A was obtained from the cross-sectional side. Note that a nanometer-size electron beam with a probe diameter of 30 nm, 20 nm, 10 nm, or 1 nm was used for electron diffraction. A diffraction pattern obtained using a nanometer-size electron beam is referred to as a nanobeam electron diffraction pattern. Note that the nanobeam electron diffraction pattern was obtained using a Hitachi HF-2000 field-emission transmission electron microscope under conditions where the accelerating voltage was 200 kV and the camera length was 400 mm. As a shooting medium, a film was used.

Figure 8:
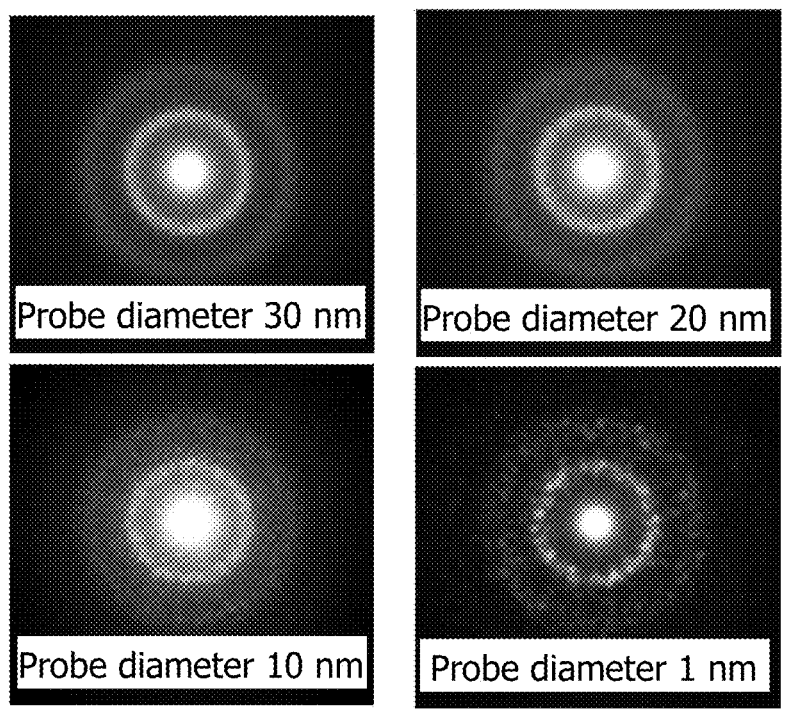
FIG. 8 shows nanobeam electron diffraction patterns of an nc-OS film.

As shown in FIG. 8, a ring-shaped nanobeam electron diffraction pattern was observed in Sample A. When the ring was observed in detail, spots were observed. The number of spots was increased as the probe diameter is reduced.

Figure 9:
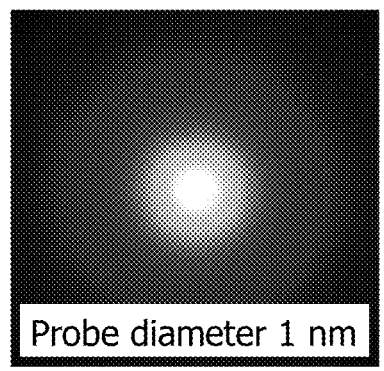
FIG. 9 shows a nanobeam electron diffraction pattern of a quartz substrate.

For comparison, when nanobeam electron diffraction was performed on quartz, which is in an amorphous state, using an electron beam with a probe diameter of 1 nm, a halo pattern shown in FIG. 9 was observed. Therefore, spots in the nanobeam electron diffraction pattern are evidence that Sample A is an nc-OS film.

To analyze the structure in more detail, the nc-OS film was thinned to obtain Sample B with a thickness of several nanometers (approximately greater than or equal to 5 nm and less than or equal to 10 nm). Then, an electron beam with a probe diameter of 1 nm entered Sample B from the cross-sectional side to obtain nanobeam electron diffraction patterns. As a result, as shown in FIG. 10, electron diffraction patterns having spots indicating crystallinity were obtained.

According to FIG. 10, diffraction patterns showing crystallinity were obtained from Sample B, but orientation along a crystal plane in a specific direction was not observed.

As described above, although an nc-OS film is not distinguished from an amorphous oxide semiconductor film in some cases depending on an analysis method, an exact analysis makes it possible to distinguish the nc-OS film and the amorphous oxide semiconductor film. Moreover, it is found that a microscopic region in the nc-OS film has a periodic atomic order. Therefore, the nc-OS film is an oxide semiconductor film that has high regularity as compared to an amorphous oxide semiconductor film.

<Detailed Structural Analysis of Nc-OS Film>

In the following description, detailed structural analysis of an nc-OS film was conducted with calculation. Note that the case where the nc-OS film is an In—Ga—Zn oxide film is described as an example.

First, a method for structural analysis is described.

Figure 11A:
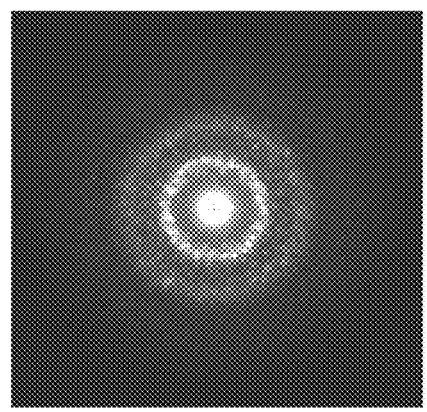
FIGS. 11A to 11C show structural analysis results of an nc-OS film.

In FIG. 11A, the nc-OS film was thinned to obtain a sample with a thickness of approximately 50 nm, and then a nanobeam electron diffraction pattern of the sample was obtained. Note that an imaging plate was preferably used as a shooting medium to conduct detailed structural analysis. Note that as the shooting medium, a charge coupled device (CCD) image sensor may be used.

Figure 11B:
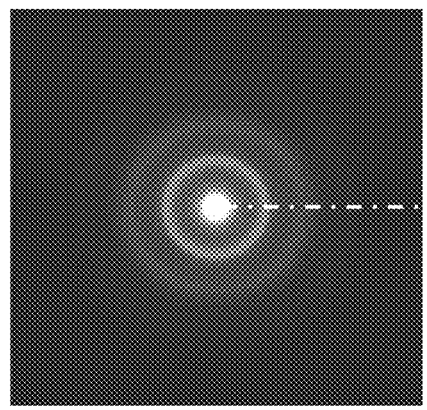
Figure 11C:
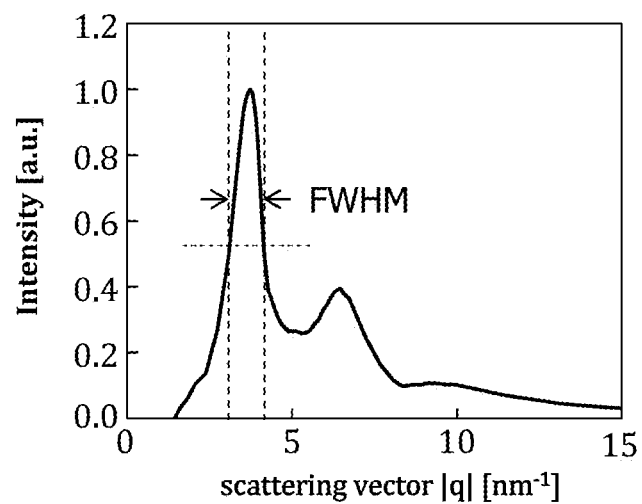

FIG. 11B shows an electron diffraction pattern that was averaged in the uniform magnitude of a scattering vector |q| by rotating the electron diffraction pattern shown in FIG. 11A with a center of the pattern as an axis. FIG. 11C shows an electron diffraction intensity profile along a dashed-dotted line shown in FIG. 11B, where the horizontal axis indicates the magnitude of scattering vector $|q|$ [nm$^{-1}$] and the vertical axis indicates the diffraction intensity [arbitrary unit]. Note that the maximum diffraction intensity of a first peak in the electron diffraction intensity profile is shown as 1.

The structural analysis is performed focusing on a full width half maximum (FWHM) of the first peak in FIG. 11C. Note that in FIG. 11C, a transmitted wave in the vicinity of the center in FIG. 11B is not taken into consideration for easy understanding.

Figure 12:
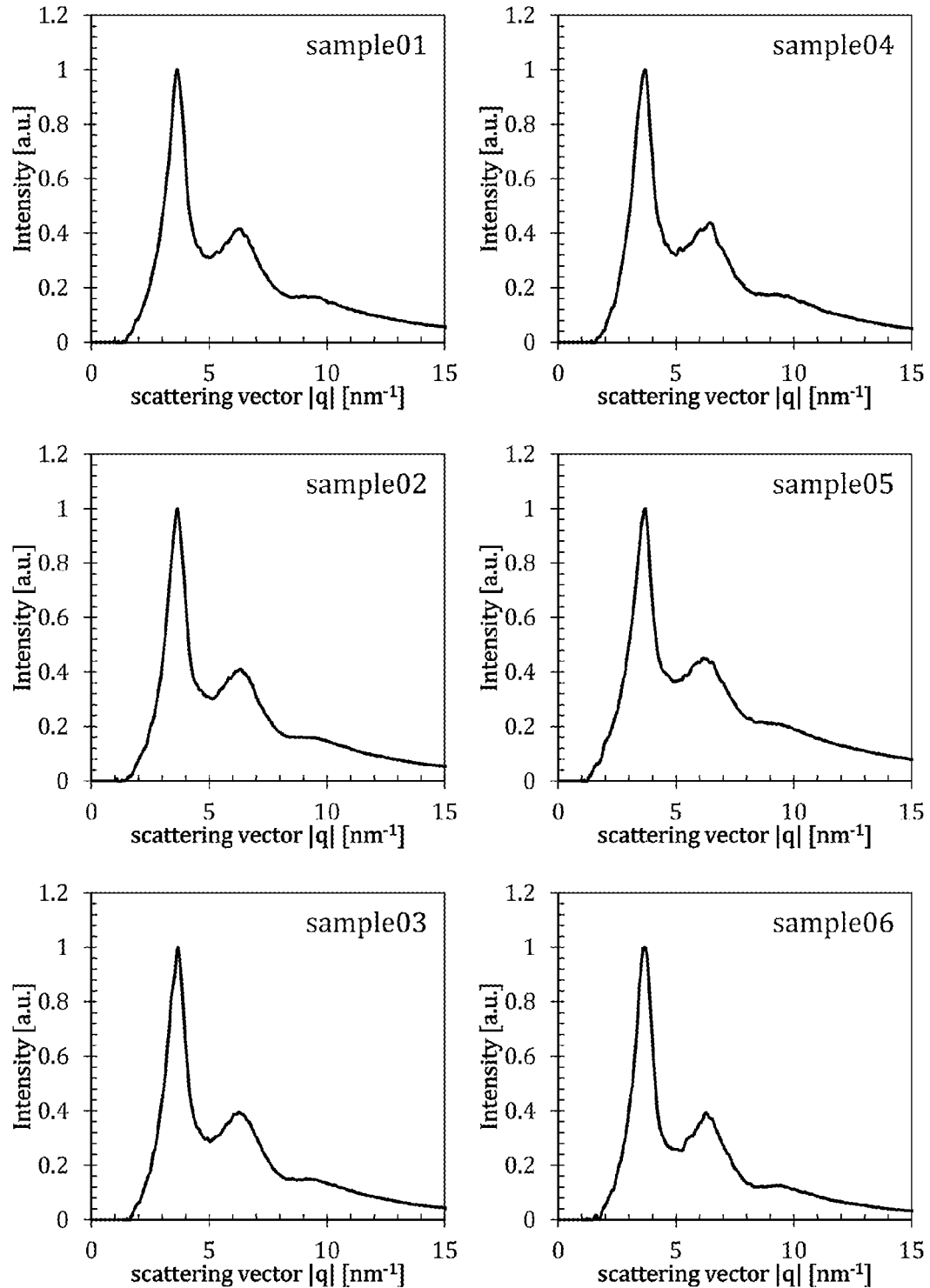
FIG. 12 shows structural analysis results of an nc-OS film.
Figure 13:
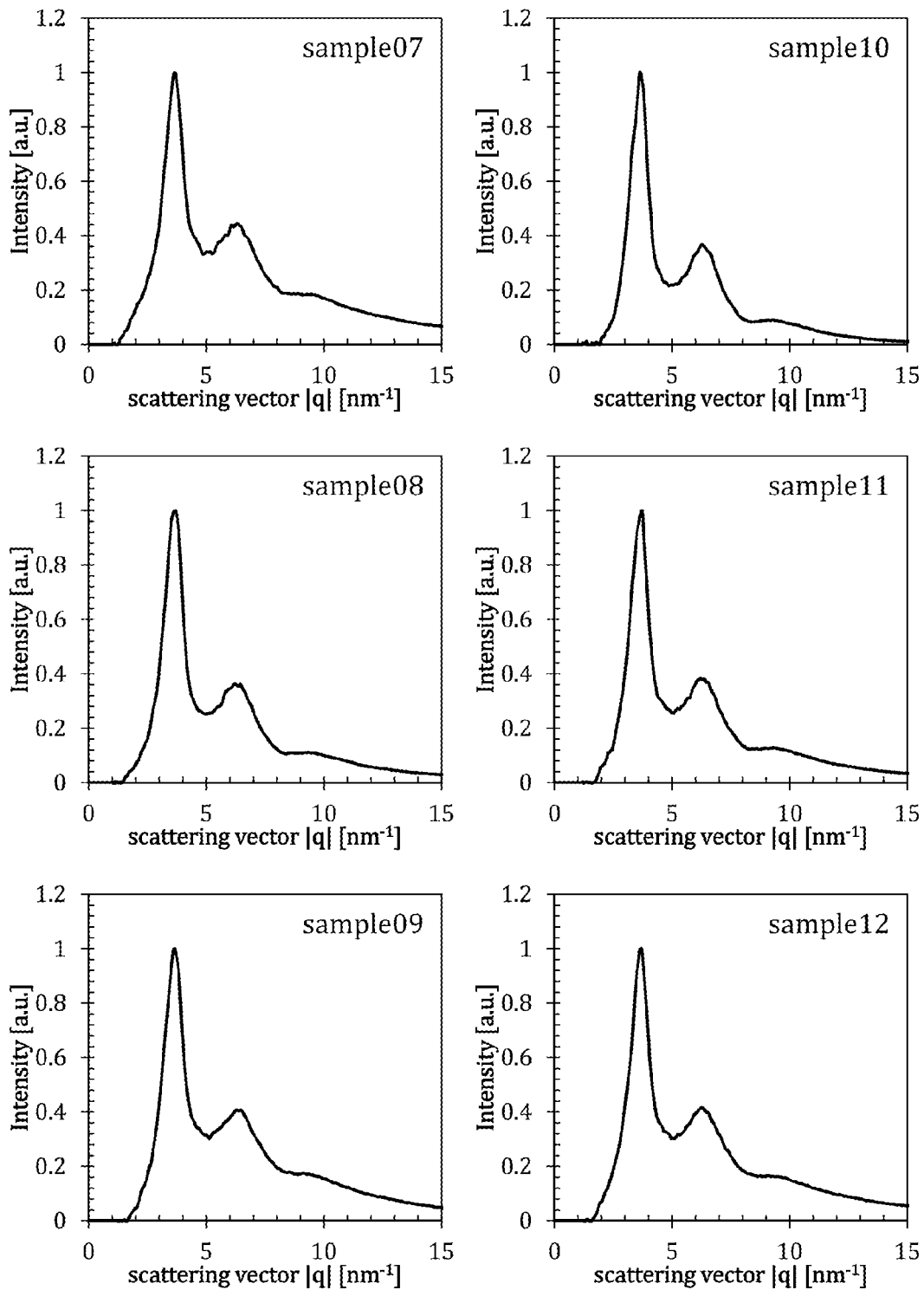
FIG. 13 shows structural analysis results of an nc-OS film.

Through the above method, electron diffraction intensity profiles of samples 1 to 12 (samples 01 to 12) which were each an nc-OS film thinned to approximately 50 nm were obtained. Note that nanobeam electron diffraction patterns were obtained in such a manner that a nanobeam with a probe diameter of 10 nm was incident on cross sections of the samples. Then, the obtained electron diffraction patterns were averaged in the uniform magnitude of a scattering vector |q| by rotating the diffraction patterns with centers thereof as an axis, whereby the electron diffraction intensity profiles were created. FIG. 12 and FIG. 13 show the electron diffraction intensity profiles of the samples 1 to 12.

Next, profiles of electron diffraction intensity of crystalline InGaZnO$_4$ and electron diffraction intensity of amorphous InGaZnO$_4$ were created by the calculation.

For the calculation, TEM simulation software jems was used. The calculation mode was set to a mode for calculating powder patterns, and as the fitting function, Gaussian function was used. As the calculation conditions, the accelerating voltage was set to 200 kV, and the camera length was set to 400 mm.

For the calculation, InGaZnO$_4$ structure models shown in FIG. 14 were used. Note that the structure model of crystalline InGaZnO$_4$ was obtained from Inorganic Material Database of National Institute for Materials Science (AtomWork, http://crystdb.nims.go.jp). The structure model of amorphous InGaZnO$_4$ was made by a melt-quench method in classical molecular dynamics calculation. Specifically, InGaZnO$_4$ was melted at 4000 K and then the temperature was lowered by 200 K every 0.2 nanoseconds to reach 300 K. Note that the temperature was lowered only by 100 K from 400 K so as to finally reach 300 K. As software for the classical molecular dynamics calculation, "SCIGRESS ME 2.0" was used, and for potential, Born-Mayer-Huggins potential was used.

In the calculation, structure factors in each plane (hkl) of the structure models were determined, and the diffraction position and the diffraction intensity were calculated. A shape of a diffraction peak of each plane (hkl) was calculated by fitting using Gaussian function. Note that the sample shape was isotropic powder. The powder size generally relates to FWHM of the diffraction peak.

Figure 15:
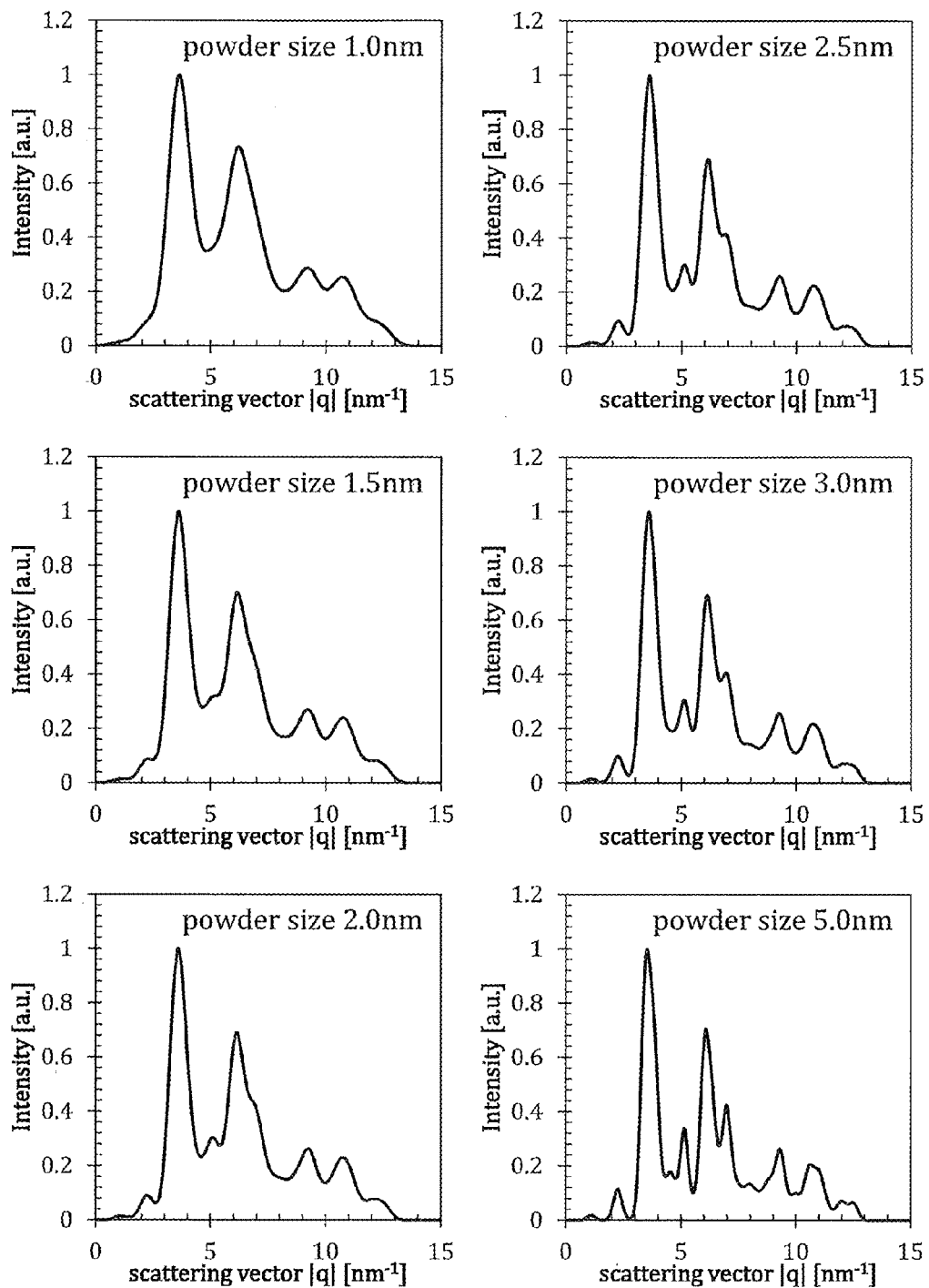
FIG. 15 shows structural analysis results obtained by calculation of crystalline $InGaZnO_4$.

FIG. 15 shows profiles of electron diffraction intensity of crystalline InGaZnO$_4$, which were obtained by the calculation. According to FIG. 15, a plurality of peaks are observed in crystalline InGaZnO$_4$. In addition, as the powder size is increased, the FWHM width of the first peak becomes narrower.

Figure 16:
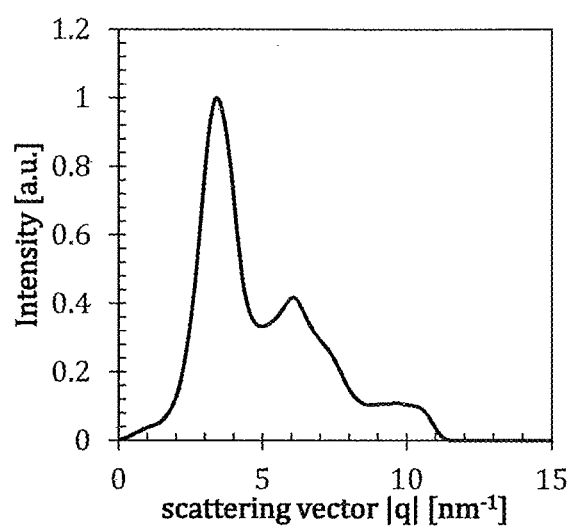
FIG. 16 shows structural analysis results obtained by calculation of amorphous $InGaZnO_4$.

FIG. 16 shows profiles of electron diffraction intensity of amorphous InGaZnO$_4$, which were obtained by the calculation. According to FIG. 16, although a plurality of peaks were observed in the profile of the amorphous InGaZnO$_4$, it was difficult to separate another peak from the other parts of profile after a second peak.

Next, FWHM of the first peaks obtained from the calculation results of the crystalline InGaZnO$_4$ and amorphous InGaZnO$_4$ and FWHM of the actual measured first peaks of samples of nc-OS films (Sample 1 to Sample 12) were compared. The comparison results are shown in FIG. 17.

According to FIG. 17, a calculation value of FWHM of the first peak of amorphous InGaZnO$_4$ is 1.5 [nm$^{-1}$] or more.

According to FIG. 17, each calculation value of FWHM of the first peaks of crystalline InGaZnO$_4$ was approximately in a range of 0.7 [nm$^{-1}$] to 1.3 [nm$^{-1}$]. In the case of crystalline InGaZnO$_4$, as the powder size is increased, the periodicity of atomic arrangement becomes high. Thus, the larger that powder size is, the narrower the FWHM widths of the first peaks are.

Furthermore, according to FIG. 17, each actual measured value of FWHM of the first peaks of nc-OS films is approximately in a range of 0.9 [nm$^{-1}$] to 1.1 [nm$^{-1}$]. Thus, it is found that the FWHM widths of the first peaks of the nc-OS films are narrower than that of the amorphous InGaZnO$_4$ and is close to those of the crystalline InGaZnO$_4$.

Moreover, the FWHM width of the first peak was compared between the nc-OS film and the crystalline InGaZnO$_4$. The comparison result indicated that the size of crystal was about in a range from 1 nm to 3 nm.

<Application of Nc-OS Film>

The nc-OS film can be used as a semiconductor film of a transistor, for example.

<Transistor Including Nc-OS Film>

The structure of a transistor of one embodiment of the present invention and a manufacturing method thereof are described below.

<Transistor Structure (1)>

First, an example of a top-gate top-contact transistor is described.

FIGS. 18A, 18B1, 18B2, and 18C are a top view and cross-sectional views of the transistor. FIG. 18A is the top view of the transistor. FIGS. 18B1 and 18B2 are the cross-sectional views taken along dashed-dotted line A1-A2 in FIG. 18A. FIG. 18C is the cross-sectional view taken along dashed-dotted line A3-A4 in FIG. 18A.

The transistor in FIGS. 18B1 and 18B2 includes a base insulating film 202 over a substrate 200; an oxide semiconductor film 206 over the base insulating film 202; a source electrode 216a and a drain electrode 216b over the oxide semiconductor film 206; a gate insulating film 212 over the oxide semiconductor film 206, the source electrode 216a, and the drain electrode 216b; and a gate electrode 204 over the gate insulating film 212. The transistor preferably further includes a protective insulating film 218 over the source electrode 216a, the drain electrode 216b, the gate insulating film 212, and the gate electrode 204; and a wiring 226a and a wiring 226b over the protective insulating film 218. Moreover, the gate insulating film 212 and the protective insulating film 218 have openings reaching the source electrode 216a and the drain electrode 216b. The wiring 226a and the wiring 226b are in contact with the source electrode 216a and the drain electrode 216b through the openings, respectively. Note that in some cases, the transistor does not necessarily include the base insulating film 202.

In the top view of FIG. 18A, the distance between the source electrode 216a and the drain electrode 216b in a region of the oxide semiconductor film 206 that overlaps with the gate electrode 204 is called a channel length. Moreover, in the overlapped region of the oxide semiconductor film 206 and the gate electrode 204, a line connecting the center points in the region between the source electrode 216a and the drain electrode 216b is called a channel width. Note that a channel formation region refers to a region of the oxide semiconductor film 206 that overlaps with the gate electrode 204 and is located between the source electrode 216a and the drain electrode 216b. Furthermore, a channel refers to a region of the oxide semiconductor film 206 through which current mainly flows.

Note that as illustrated in FIG. 18A, the gate electrode 204 is provided so that the edge of the channel formation region in the oxide semiconductor film 206 is located on the inner side than the edge of the gate electrode 204 in the top view. This can suppress generation of carriers in the oxide semiconductor film 206 due to incident light from the gate electrode 204 side. In other words, the gate electrode 204 functions as a light-blocking film. Note that the channel formation region in the oxide semiconductor film 206 may be provided so as to extend to the outside of the gate electrode 204.

The oxide semiconductor film 206 is described below. The above-described nc-OS film can be applied to the oxide semiconductor film 206.

The oxide semiconductor film 206 is an oxide containing indium. An oxide can have a high carrier mobility (electron mobility) by containing indium, for example. The oxide semiconductor film 206 preferably contains an element M. The element M is aluminum, gallium, yttrium, or tin, for example. The element M is an element having a high bonding energy with oxygen, for example. The element M is an element that can increase the energy gap of the oxide, for example. Furthermore, the oxide semiconductor film 206 preferably contains zinc. An oxide containing zinc is easily crystallized, for example. The energy at the top of the valence band of the oxide can be controlled with the atomic ratio of zinc, for example.

Note that the oxide semiconductor film 206 is not limited to the oxide containing indium. The oxide semiconductor film 206 may be, for example, a Zn—Sn oxide or a Ga—Sn oxide.

A first oxide semiconductor film and a second oxide semiconductor film may be provided over and under the channel formation region in the oxide semiconductor film 206. Note that the second oxide semiconductor film is provided between the oxide semiconductor film 206 and the gate insulating film 212.

The first oxide semiconductor film contains one or more elements that are not oxygen and are contained in the oxide semiconductor film 206. Since the first oxide semiconductor film contains one or more elements that are not oxygen and are contained in the oxide semiconductor film 206, an interface state is unlikely to be formed at the interface between the oxide semiconductor film 206 and the first oxide semiconductor film.

The second oxide semiconductor film contains one or more elements that are not oxygen and are contained in the oxide semiconductor film 206. Since the second oxide semiconductor film contains one or more elements that are not oxygen and are contained in the oxide semiconductor film 206, an interface state is unlikely to be formed at the interface between the oxide semiconductor film 206 and the second oxide semiconductor film.

In the case of using an In-M-Zn oxide as the first oxide semiconductor film, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. In the case of using an In-M-Zn oxide as the oxide semiconductor film 206, when summation of In and M is assumed to be 100 atomic %, the proportions of In and M are preferably set to be greater than or equal to 25 atomic % and less than 75 atomic %, respectively, and further preferably greater than or equal to 34 atomic % and less than 66 atomic %, respectively. In the case of using an In-M-Zn oxide as the second oxide semiconductor film, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. Note that the second oxide semiconductor film may be formed using the same kind of oxide as that of the first oxide semiconductor film.

Here, in some cases, there is a mixed region of the first oxide semiconductor film and the oxide semiconductor film 206 between the first oxide semiconductor film and the oxide semiconductor film 206. Moreover, in some cases, there is a mixed region of the oxide semiconductor film 206 and the second oxide semiconductor film between the oxide semiconductor film 206 and the second oxide semiconductor film. The mixed region has a low density of interface states. For that reason, the stack including the first oxide semiconductor film, the oxide semiconductor film 206, and the second oxide semiconductor film has a band structure where energy at each interface is changed continuously (continuous junction).

As the oxide semiconductor film 206, an oxide with a wide energy gap is used. For example, the energy gap of the oxide semiconductor film 206 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

As the first oxide semiconductor film, an oxide with a wide energy gap is used. For example, the energy gap of the first oxide semiconductor film is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the second oxide semiconductor film, an oxide with a wide energy gap is used. The energy gap of the second oxide semiconductor film is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV. Note that the first oxide semiconductor film and the second oxide semiconductor film have wider energy gaps than the oxide semiconductor film 206.

As the oxide semiconductor film 206, an oxide having an electron affinity higher than that of the first oxide semiconductor film is used. For example, as the oxide semiconductor film 206, an oxide having an electron affinity higher than that of the first oxide semiconductor film by 0.07 eV or more and 1.3 eV or less, preferably 0.1 eV or more and 0.7 eV or less, further preferably 0.15 eV or more and 0.4 eV or less is used. Note that electron affinity refers to an energy difference between the vacuum level and the bottom of the conduction band.

Moreover, as the oxide semiconductor film 206, an oxide having an electron affinity higher than that of the second oxide semiconductor film is used. For example, as the oxide semiconductor film 206, an oxide having an electron affinity higher than that of the second oxide semiconductor film by 0.07 eV or more and 1.3 eV or less, preferably 0.1 eV or more and 0.7 eV or less, further preferably 0.15 eV or more and 0.5 eV or less is used.

In that case, when an electric field is applied to the gate electrode 204, a channel is formed in the oxide semiconductor film 206 having an electron affinity higher than those of the first oxide semiconductor film and the second oxide semiconductor film.

To increase the on-state current of the transistor, the thickness of the second oxide semiconductor film is preferably as small as possible. The thickness of the second oxide semiconductor film is set to be less than 10 nm, preferably less than or equal to 5 nm, further preferably less than or equal to 3 nm, for example. Meanwhile, the second oxide semiconductor film has a function of blocking elements other than oxygen (such as silicon) contained in the gate insulating film 212 from entering the oxide semiconductor film 206 where a channel is formed. For this reason, the second oxide semiconductor film preferably has a certain thickness. The thickness of the second oxide semiconductor film is set to be greater than or equal to 0.3 nm, preferably greater than or equal to 1 nm, further preferably greater than or equal to 2 nm, for example.

To increase the reliability, the first oxide semiconductor film is preferably formed thick, and the oxide semiconductor film 206 and the second oxide semiconductor film are preferably formed thin. Specifically, the thickness of the first oxide semiconductor film is greater than or equal to 20 nm, preferably greater than or equal to 30 nm, further preferably greater than or equal to 40 nm, still further preferably greater than or equal to 60 nm. In that case, the distance from the interface between the base insulating film 202 and the first oxide semiconductor film to the oxide semiconductor film 206 where the channel is formed can be greater than or equal to 20 nm, preferably greater than or equal to 30 nm, further preferably greater than or equal to 40 nm, still further preferably greater than or equal to 60 nm. To prevent the productivity of the semiconductor device from being lowered, the thickness of the first oxide semiconductor film is less than or equal to 200 nm, preferably less than or equal to 120 nm, further preferably less than or equal to 80 nm. The thickness of the oxide semiconductor film 206 is greater than or equal to 3 nm and less than or equal to 100 nm, preferably greater than or equal to 3 nm and less than or equal to 80 nm, further preferably greater than or equal to 3 nm and less than or equal to 50 nm.

For example, the first oxide semiconductor film may be thicker than the oxide semiconductor film 206, and the oxide semiconductor film 206 may be thicker than the second oxide semiconductor film.

The influence of impurities in the oxide semiconductor film 206 is described below. In order that the transistor have stable electrical characteristics, it is effective to reduce the concentration of impurities in the oxide semiconductor film 206 so that the oxide semiconductor film 206 has a lower carrier density and is highly purified. The carrier density of the oxide semiconductor film 206 is set to be lower than $1\times10^{17}/cm^3$, lower than $1\times10^{15}/cm^3$, or lower than $1\times10^{13}/cm^3$. In order to reduce the concentration of impurities in the oxide semiconductor film 206, it is preferable that the concentration of impurities in a film that is adjacent to the oxide semiconductor film 206 be also reduced.

Silicon contained in the oxide semiconductor film 206 might serve as a carrier trap or a carrier generation source. The concentration of silicon in a region between the oxide semiconductor film 206 and the first oxide semiconductor film, which is measured by secondary ion mass spectrometry (SIMS), is lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor film 206 and the second oxide semiconductor film, which is measured by SIMS, is lower than $1\times10^{19}$ atoms/cm$^3$, preferably lower than $5\times10^{18}$ atoms/cm$^3$, further preferably lower than $2\times10^{18}$ atoms/cm$^3$.

When hydrogen is contained in the oxide semiconductor film 206, carrier density might be increased. The concentration of hydrogen in the oxide semiconductor film 206 measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor film 206, carrier density might be increased. The concentration of nitrogen in the oxide semiconductor film 206 measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the first oxide semiconductor film in order to reduce the concentration of hydrogen in the oxide semiconductor film 206. The concentration of hydrogen in the first oxide semiconductor film measured by SIMS can be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, it is preferable to reduce the concentration of nitrogen in the first oxide semiconductor film in order to reduce the concentration of nitrogen in the oxide semiconductor film 206. The concentration of nitrogen in the first oxide semiconductor film measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is also preferable to reduce the concentration of hydrogen in the second oxide semiconductor film in order to reduce the concentration of hydrogen in the oxide semiconductor film 206. The concentration of hydrogen in the second oxide semiconductor film measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is also preferable to reduce the concentration of nitrogen in the second oxide semiconductor film in order to reduce the concentration of nitrogen in the oxide semiconductor film 206. The concentration of nitrogen in the second oxide semiconductor film measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The base insulating film 202 illustrated in FIGS. 18A to 18C is formed of, for example, a single layer or a stack of an insulating film containing silicon oxide or silicon oxynitride. Moreover, as the base insulating film 202, an insulating film containing excess oxygen is preferably used. The thickness of the base insulating film 202 is, for example, greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The base insulating film 202 may be a stack including a silicon nitride film as a first layer and a silicon oxide film as a second layer. A silicon oxynitride film may be used instead of the silicon oxide film. A silicon nitride oxide film may be used instead of the silicon nitride film. As the silicon oxide film, a silicon oxide film having a small defect density is preferably used. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon nitride film, a silicon nitride film that is less likely to release hydrogen and ammonia is used. The amount of released hydrogen and ammonia can be measured by thermal desorption spectroscopy (TDS). Moreover, as the silicon nitride film, a silicon nitride film through which hydrogen, water, and oxygen do not permeate or hardly permeate is used.

Alternatively, the base insulating film 202 may be a stack including a silicon nitride film as a first layer, a first silicon oxide film as a second layer, and a second silicon oxide film as a third layer. In that case, the first silicon oxide film and/or the second silicon oxide film may be a silicon oxynitride film. A silicon nitride oxide film may be used instead of the silicon nitride film. As the first silicon oxide film, a silicon oxide film having a small defect density is preferably used. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide film, a silicon oxide film containing excess oxygen is used. As the silicon nitride film, a silicon nitride film that is less likely to release hydrogen and ammonia is used. Moreover, as the silicon nitride film, a silicon nitride film through which hydrogen, water, and oxygen do not permeate or hardly permeate is used.

The source electrode 216a and the drain electrode 216b may be formed using, for example, a single layer or a stack of a conductive film containing aluminum, titanium, chromium, cobalt, nickel, copper, yttrium, zirconium, molybdenum, ruthenium, silver, tantalum, or tungsten.

The gate insulating film 212 may be formed using, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. As the gate insulating film 212, an insulating film containing excess oxygen is preferably used. The thickness (equivalent oxide thickness) of the gate insulating film 212 is, for example, greater than or equal to 1 nm and less than or equal to 500 nm, preferably greater than or equal to 3 nm and less than or equal to 300 nm, further preferably greater than or equal to 5 nm and less than or equal to 100 nm, still further preferably greater than or equal to 5 nm and less than or equal to 50 nm.

The gate insulating film 212 may be a stack including a silicon nitride film as a first layer and a silicon oxide film as a second layer. A silicon oxynitride film may be used instead of the silicon oxide film. A silicon nitride oxide film may be used instead of the silicon nitride film. As the silicon oxide film, a silicon oxide film having a small defect density is preferably used. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon oxide film, a silicon oxide film containing excess oxygen is preferably used. As the silicon nitride film, a silicon nitride film that is less likely to release hydrogen and ammonia is used. The amount of released hydrogen and ammonia can be measured by TDS.

The gate electrode 204 may be formed using, for example, a single layer or a stack of a conductive film containing aluminum, titanium, chromium, cobalt, nickel, copper, yttrium, zirconium, molybdenum, ruthenium, silver, tantalum, or tungsten.

The protective insulating film 218 is formed using a single layer or a stack of an insulating film containing silicon oxide, silicon oxynitride, germanium oxide, yttrium oxide, zirconium oxide, lanthanum oxide, neodymium oxide, hafnium oxide, or tantalum oxide. Moreover, as the protective insulating film 218, an insulating film containing excess oxygen is preferably used. An insulating film that blocks oxygen may be used as the protective insulating film 218. The thickness of the protective insulating film 218 is, for example, greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The wirings 226a and 226b may be formed using, for example, a single layer or a stack of a conductive film containing aluminum, titanium, chromium, cobalt, nickel, copper, yttrium, zirconium, molybdenum, ruthenium, silver, tantalum, or tungsten.

There is no significant limitation on the substrate 200. For example, a glass substrate, a ceramic substrate, a quartz substrate, or a sapphire substrate may be used as the substrate 200. Alternatively, a single crystal semiconductor substrate or a polycrystalline semiconductor substrate of silicon, silicon carbide, or the like, a compound semiconductor substrate of silicon germanium or the like, a silicon-on-insulator (SOI) substrate, or the like may be used as the substrate 200. Still alternatively, any of these substrates provided with a semiconductor element may be used as the substrate 200.

A flexible substrate may be used as the substrate 200. As a method for providing a transistor over a flexible substrate, there is a method in which a transistor is formed over a non-flexible substrate, and then the transistor is separated and transferred to the substrate 200 that is a flexible substrate. In that case, a separation layer is preferably provided between the non-flexible substrate and the transistor.

<Transistor Structure (2)>

Next, an example of a bottom-gate top-contact transistor is described.

Figure 19A:
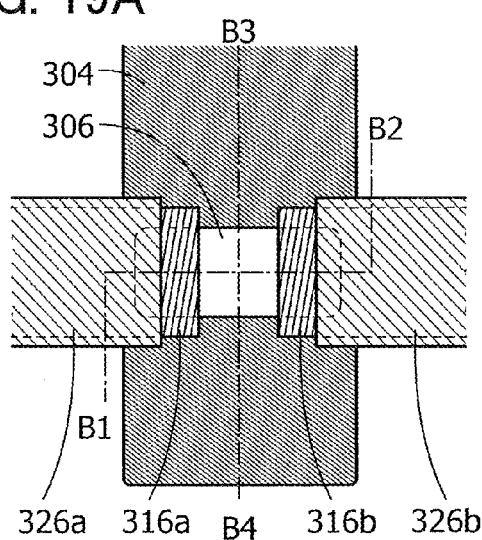
FIGS. 19A, 19B, and 19C are a top view and cross-sectional views illustrating an example of a transistor of one embodiment of the present invention.
Figure 19C:
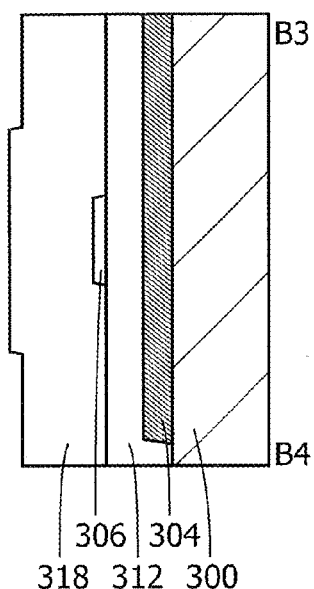
Figure 19B:
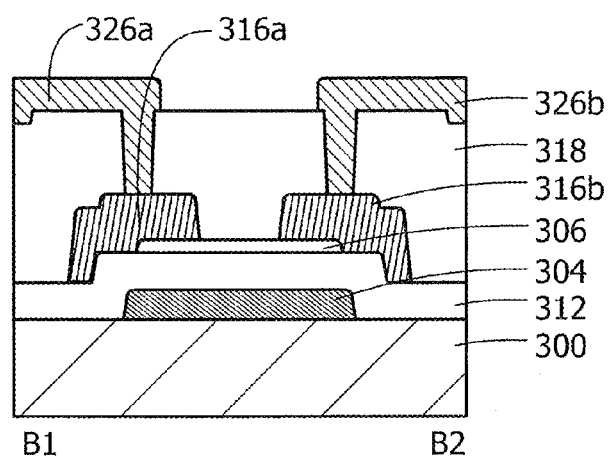

FIGS. 19A to 19C are a top view and cross-sectional views of the transistor. FIG. 19A is the top view of the transistor. FIG. 19B is the cross-sectional view taken along dashed-dotted line B1-B2 in FIG. 19A. FIG. 19C is the cross-sectional view taken along dashed-dotted line B3-B4 in FIG. 19A.

The transistor in FIGS. 19B and 19C includes a gate electrode 304 over a substrate 300; a gate insulating film 312 over the gate electrode 304; an oxide semiconductor film 306 over the gate insulating film 312; and a source electrode 316a and a drain electrode 316b over the oxide semiconductor film 306. The transistor preferably further includes a protective insulating film 318 over the source electrode 316a, the drain electrode 316b, the gate insulating film 312, and the oxide semiconductor film 306; and a wiring 326a and a wiring 326b over the protective insulating film 318. Moreover, the protective insulating film 318 has openings reaching the source electrode 316a and the drain electrode 316b. The wiring 326a and the wiring 326b are in contact with the source electrode 316a and the drain electrode 316b through the openings, respectively. Note that the transistor may include a base insulating film between the substrate 300 and the gate electrode 304.

The description of the transistor illustrated in FIGS. 18A to 18C can be referred to for part of the transistor illustrated in FIGS. 19A to 19C.

For example, the description of the substrate 200 can be referred to for the substrate 300. The description of the oxide semiconductor film 206 can be referred to for the oxide semiconductor film 306. The description of the source electrode 216a and the drain electrode 216b can be referred to for the source electrode 316a and the drain electrode 316b. The description of the gate insulating film 212 can be referred to for the gate insulating film 312. The description of the gate electrode 204 can be referred to for the gate electrode 304. The description of the wirings 226a and 226b can be referred to for the wirings 326a and 326b.

Note that as illustrated in FIG. 19A, the gate electrode 304 is provided so that the edge of the oxide semiconductor film 306 is located on the inner side than the edge of the gate electrode 304 in the top view. This can suppress generation of carriers in the oxide semiconductor film 306 due to incident light from the gate electrode 304 side. In other words, the gate electrode 304 functions as a light-blocking film. Note that the oxide semiconductor film 306 may be provided so as to extend to the outside of the gate electrode 304.

The protective insulating film 318 illustrated in FIGS. 19A to 19C is formed using, for example, a single layer or a stack of an insulating film containing silicon oxide or silicon oxynitride. Moreover, the protective insulating film 318 is preferably formed using an insulating film containing excess oxygen. The thickness of the protective insulating film 318 is, for example, greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The protective insulating film 318 may be, for example, a stack including a silicon oxide film as a first layer and a silicon nitride film as a second layer. A silicon oxynitride film may be used instead of the silicon oxide film. A silicon nitride oxide film may be used instead of the silicon nitride film. As the silicon oxide film, a silicon oxide film having a small defect density is preferably used. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon nitride film, a silicon nitride film that is less likely to release hydrogen and ammonia is used. The amount of released hydrogen and ammonia can be measured by TDS. Moreover, as the silicon nitride film, a silicon nitride film through which hydrogen, water, and oxygen do not permeate or hardly permeate is used.

Alternatively, the protective insulating film 318 may be, for example, a stack including a first silicon oxide film as a first layer, a second silicon oxide film as a second layer, and a silicon nitride film as a third layer. In that case, the first silicon oxide film and/or the second silicon oxide film may be a silicon oxynitride film. A silicon nitride oxide film may be used instead of the silicon nitride film. As the first silicon oxide film, a silicon oxide film having a small defect density is preferably used. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide film, a silicon oxide film containing excess oxygen is used. As the silicon nitride film, a silicon nitride film that is less likely to release hydrogen and ammonia is used. Moreover, as the silicon nitride film, a silicon nitride film through which hydrogen, water, and oxygen do not permeate or hardly permeate is used.

The transistor described above can be used for a variety of applications (e.g., a display device, a memory, and a CPU).

<Display Device>

A display device including the above transistor is described below.

As a display element provided in the display device, a liquid crystal element (also referred to as a liquid crystal display element), a light-emitting element (also referred to as a light-emitting display element), or the like can be used. The light-emitting element includes, in its category, an element whose luminance is controlled by current or voltage, specifically an inorganic electroluminescent (EL) element, an organic EL element, and the like. Furthermore, a display medium whose contrast is changed by an electric effect, such as electronic ink and electrophoretic element, can be used as the display element. A display device including an EL element and a display device including a liquid crystal element are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

<EL Display Device>

First, a display device including an EL element (also referred to as an EL display device) is described.

Figure 20A:
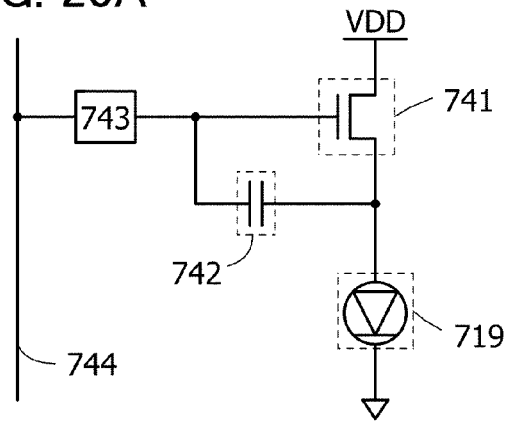
FIGS. 20A to 20C are a circuit diagram, a top view, and a cross-sectional view illustrating an example of a display device of one embodiment of the present invention.

FIG. 20A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Moreover, in the case where a connection portion is disclosed in this specification and the like, it can be determined that one embodiment of the invention in which a connection portion is not specified is disclosed in this specification and the like, in some cases. In particular, in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, one embodiment of the present invention can be clear when a function of a circuit is specified. Moreover, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 20A includes a switching element 743, a transistor 741, a capacitor 742, and a light-emitting element 719.

Note that FIG. 20A and the like each illustrate an example of a circuit configuration; thus, a transistor can be provided additionally. On the other hand, for each node in FIG. 20A, it is also possible not to provide an additional transistor, switch, passive element, or the like.

A gate of the transistor 741 is electrically connected to one terminal of the switching element 743 and one terminal of the capacitor 742. A source of the transistor 741 is electrically connected to the other terminal of the capacitor 742 and one terminal of the light-emitting element 719. A power supply potential VDD is supplied to a drain of the transistor 741. The other terminal of the switching element 743 is electrically connected to a signal line 744. A constant potential is supplied to the other terminal of the light-emitting element 719. The constant potential is a ground potential GND or a potential lower than the ground potential GND.

The transistor described above is used as the transistor 741. The transistor has stable electrical characteristics. Accordingly, an EL display device having a high display quality can be provided.

A transistor is preferably used as the switching element 743, which enables the pixel area to be small, so that an EL display device with high resolution can be obtained. The transistor described above may be used as the switching element 743; accordingly, the switching element 743 can be formed in the same process as the transistor 741, which leads to an improvement in the productivity of the EL display device.

Figure 20B:
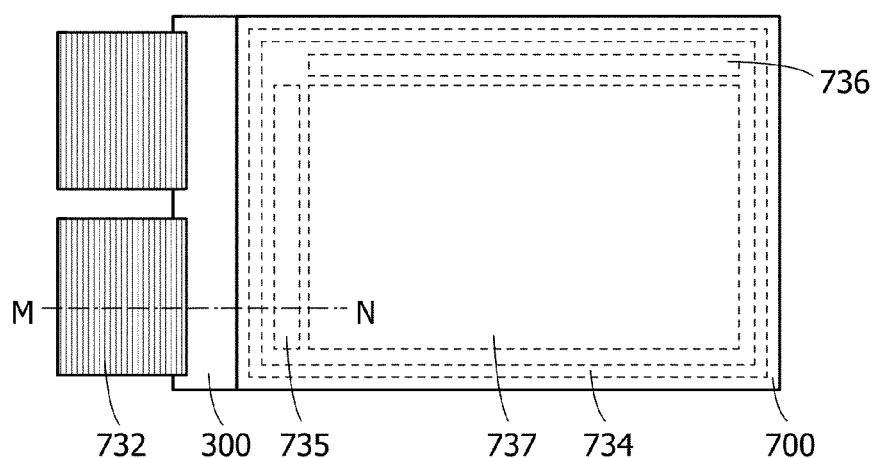

FIG. 20B is a top view of the EL display device. The EL display device includes a substrate 300, a substrate 700, a seal material 734, a driver circuit 735, a driver circuit 736, a pixel 737, and an FPC 732. The seal material 734 is provided between the substrate 300 and the substrate 700 so as to surround the pixel 737, the driver circuit 735, and the driver circuit 736. The driver circuit 735 and/or the driver circuit 736 may be provided outside the seal material 734.

Figure 20C:
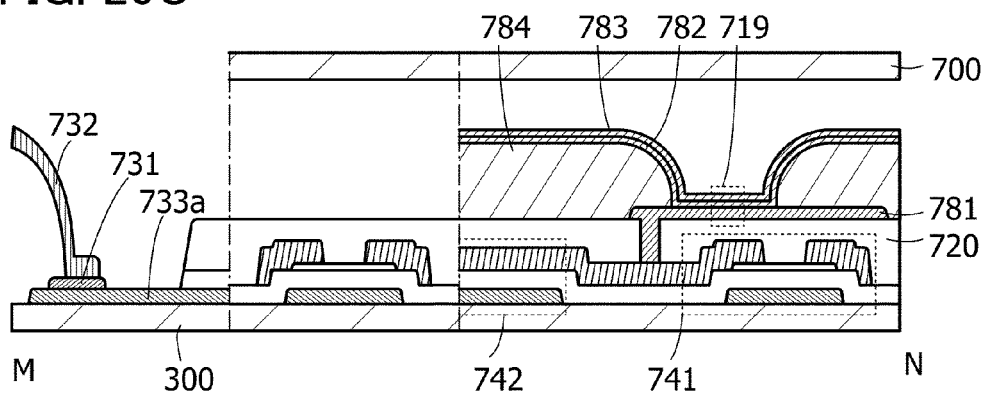

FIG. 20C is a cross-sectional view of the EL display device taken along part of dashed-dotted line M-N in FIG. 20B. The FPC 732 is connected to a wiring 733*a* through a terminal 731. The wiring 733*a* may be formed using a conductive film of the same kind as the gate electrode of the transistor 741.

FIG. 20C illustrates an example in which the transistor 741 and the capacitor 742 are provided on the same plane. With such a structure, the capacitor 742 can be formed on the same planes as the gate electrode, the gate insulating film, and the source (drain) electrode of the transistor 741. Such provision of the transistor 741 and the capacitor 742 on the same plane leads to shortening of the manufacturing process of the EL display device and an improvement of the productivity.

FIG. 20C illustrates the example in which the transistor illustrated in FIGS. 19A to 19C is applied to the transistor 741.

The transistor illustrated in FIGS. 19A to 19C is a transistor with a small shift in threshold voltage. Accordingly, the transistor is preferred for EL display devices where gray scales are varied even with the small shift of the threshold voltage.

An insulating film 720 is provided over the transistor 741 and the capacitor 742. Here, an opening reaching the source electrode of the transistor 741 is provided in the insulating film 720.

An electrode 781 is provided over the insulating film 720. The electrode 781 is in contact with the source electrode of the transistor 741 though the opening provided in the insulating film 720.

Over the electrode 781, a bank 784 having an opening reaching the electrode 781 is provided. Over the bank 784, a light-emitting layer 782 in contact with the electrode 781 through the opening provided in the bank 784 is provided. An electrode 783 is provided over the light-emitting layer 782. A region where the electrode 781, the light-emitting layer 782, and the electrode 783 overlap with one another serves as the light-emitting element 719.

<Liquid Crystal Display Device>

Next, a display device including a liquid crystal element (also referred to as a liquid crystal display device) is described.

Figure 21A:
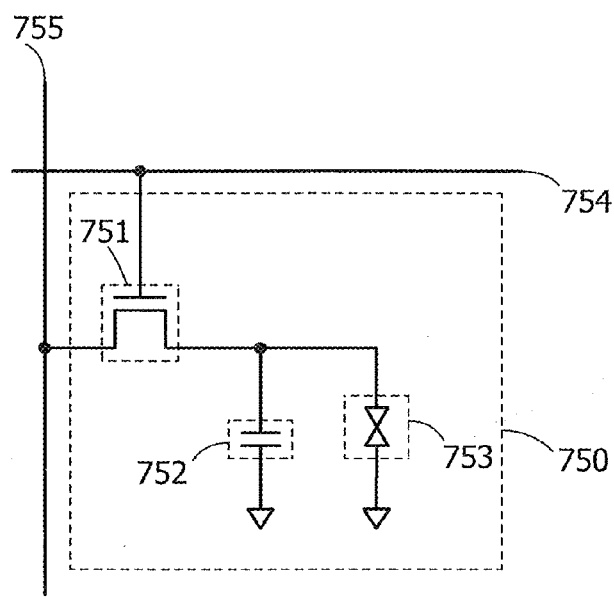
FIGS. 21A and 21B are a circuit diagram and a cross-sectional view illustrating an example of a display device of one embodiment of the present invention.

FIG. 21A is a circuit diagram illustrating a configuration example of a pixel of a liquid crystal display device. A pixel 750 shown in FIG. 21A includes a transistor 751, a capacitor 752, and an element (also referred to as a liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the wiring electrically connected to the other electrode of the liquid crystal element 753.

Figure 21B:
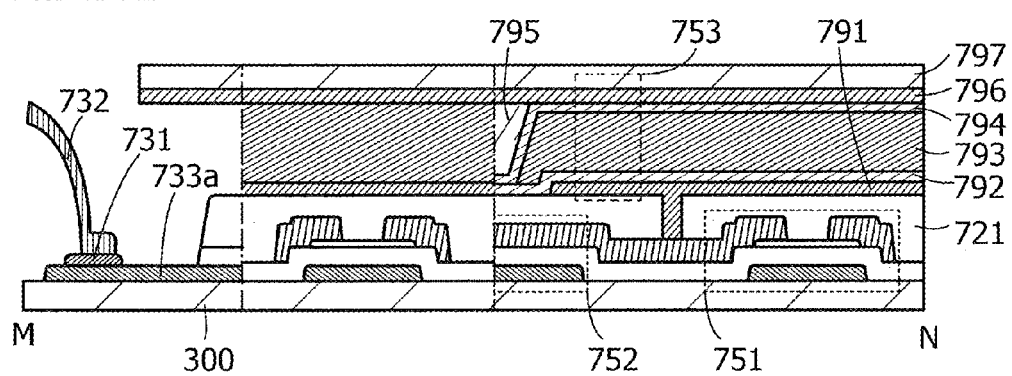

The top view of the liquid crystal display device is roughly similar to that of the EL display device. A cross-sectional view of the liquid crystal display device taken along part of dashed-dotted line M-N in FIG. 20B is illustrated in FIG. 21B. In FIG. 21B, the FPC 732 is connected to the wiring 733*a* through the terminal 731. The wiring 733*a* may be formed using a conductive film of the same kind as the gate electrode of the transistor 751.

FIG. 21B illustrates an example in which the transistor 751 and the capacitor 752 are provided on the same plane. With such a structure, the capacitor 752 can be formed on the same planes as the gate electrode, the gate insulating film, and the source (drain) electrode of the transistor 751. Such provision of the transistor 751 and the capacitor 752 on the same plane leads to shortening of the manufacturing process of the liquid crystal display device and an improvement of the productivity.

The transistor described above can be applied to the transistor 751. FIG. 21A illustrates an example in which a transistor having a structure similar to that of the transistor illustrated in FIGS. 19A to 19C is applied to the transistor 751.

The off-state current of the transistor 751 can be made extremely small. Therefore, an electric charge held in the capacitor 752 is unlikely to leak, so that the voltage applied to the liquid crystal element 753 can be maintained for a long time. Therefore, the transistor 751 can be kept off during a period in which moving images with few motions or a still image are/is displayed, whereby power for the operation of the transistor 751 can be saved in that period; accordingly a liquid crystal display device with low power consumption can be provided.

An insulating film 721 is provided over the transistor 751 and the capacitor 752. Here, an opening reaching the drain electrode of the transistor 751 is provided in the insulating film 721.

An electrode 791 is provided over the insulating film 721. The electrode 791 is in contact with the drain electrode of the transistor 751 though the opening provided in the insulating film 721.

An insulating film 792 which functions as an alignment film is provided over the electrode 791. A liquid crystal layer 793 is provided over the insulating film 792. An insulating film 794 which functions as an alignment film is provided over the liquid crystal layer 793. A spacer 795 is provided over the insulating film 794. An electrode 796 is provided over the spacer 795 and the insulating film 794. A substrate 797 is provided over the electrode 796.

In this manner, a display device having a high display quality can be provided.

<Memory 1>

In the description below, a circuit configuration and operation of a memory cell that is a semiconductor memory device including the above transistor are described with reference to FIGS. 22A and 22B.

Note that a semiconductor memory device includes a memory cell, and in some cases, further includes a driver circuit, a power supply circuit, or the like provided over a substrate which is different from a substrate provided with the memory cell.

Figure 22A:
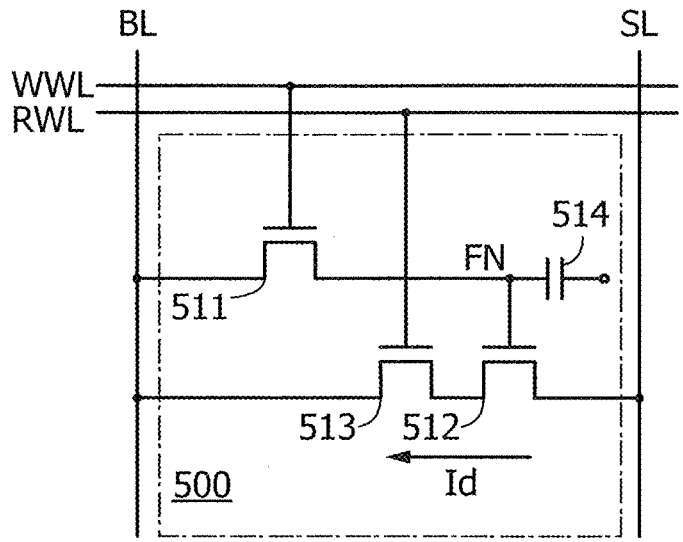
FIGS. 22A and 22B are a circuit diagram and a timing chart illustrating an example of a semiconductor memory device of one embodiment of the present invention.

FIG. 22A is a circuit diagram illustrating an example of a memory cell 500.

The memory cell 500 shown in FIG. 22A includes a transistor 511, a transistor 512, a transistor 513, and a capacitor 514. Note that in the actual case, a plurality of memory cells 500 are arranged in a matrix, though not shown in FIG. 22A.

A gate of the transistor 511 is connected to a write word line WWL. One of a source and a drain of the transistor 511 is connected to a bit line BL. The other of the source and the drain of the transistor 511 is connected to a floating node FN.

A gate of the transistor 512 is connected to the floating node FN. One of a source and a drain of the transistor 512 is connected to one of a source and a drain of the transistor 513. The other of the source and the drain of the transistor 512 is connected to a power supply line SL.

A gate of the transistor 513 is connected to a read word line RWL. The other of the source and the drain of the transistor 513 is connected to the bit line BL.

One electrode of the capacitor 514 is connected to the floating node FN. The other electrode of the capacitor 514 is supplied with a constant potential.

A word signal is supplied to the write word line WWL.

The word signal is a signal which turns on the transistor 511 so that the voltage of the bit line BL is supplied to the floating node FN.

Note that "writing of data to the memory cell" means that a word signal supplied to the write word line WWL is controlled so that the potential of the floating node FN reaches a potential corresponding to the voltage of the bit line BL. Furthermore, "reading of data from the memory cell" means that a read signal supplied to the read word line RWL is controlled so that the voltage of the bit line BL reaches a voltage corresponding to the potential of the floating node FN.

Multilevel data is supplied to the bit line BL. Moreover, a discharge voltage $V_{discharge}$ for reading data is supplied to the bit line BL.

The multilevel data is k-bit (k is an integer of 2 or more) data. Specifically, 2-bit data is 4-level data, namely, a signal having any one of the four levels of voltages.

The discharge voltage $V_{discharge}$ is a voltage which is supplied to the bit line BL to perform reading of data. After the discharge voltage $V_{discharge}$ is supplied, the bit line BL is brought into an electrically floating state. The discharge voltage $V_{discharge}$ is a voltage which is supplied to initialize the bit line BL.

A read signal is supplied to the read word line RWL.

The read signal is a signal which is supplied to the gate of the transistor 513 to perform reading of data from the memory cell in a selective manner.

The floating node FN corresponds to any node on a wiring which connects one electrode of the capacitor 514, the other of the source and the drain of the transistor 511, and the gate of the transistor 512.

Note that the potential of the floating node FN is based on the multilevel data supplied to the bit line BL. The floating node FN is in an electrically floating state when the transistor 511 is turned off.

The power supply line SL is supplied with a precharge voltage $V_{precharge}$ which is higher than a discharge voltage $V_{discharge}$ supplied to the bit line BL.

Note that the voltage of the power supply line SL needs to be the precharge voltage $V_{precharge}$ at least in a period in which data is read from the memory cell 500. Thus, in a period in which data is written to the memory cell 500 and/or in a period in which data is not read or written, the power supply line SL can be supplied with the discharge voltage $V_{discharge}$, so that the bit line BL and the power supply line SL have the same potential. With such a structure, a slight amount of shoot-through current that flows between the bit line BL and the power supply line SL can be reduced.

As another structure, the power supply line SL may be supplied with a constant voltage that is equal to the precharge voltage $V_{precharge}$. With such a structure, it is not necessary to switch the voltage of the power supply line SL between the precharge voltage $V_{precharge}$ and the discharge voltage $V_{discharge}$, and thus, power consumed in charging and discharging of the potential of the power supply line SL can be reduced.

The precharge voltage $V_{precharge}$ is supplied to the power supply line SL to change the discharge voltage $V_{discharge}$ supplied to the bit line BL by charging through the transistor 512 and the transistor 513.

The transistor 511 has a function of a switch for controlling writing of data by being switched between a conducting state and a non-conducting state. The transistor 511 also has a function of holding a potential based on written data by keeping a non-conducting state. Note that the transistor 511 is an n-channel transistor in the description.

As the transistor 511, a transistor having a low current (low off-state current) which flows between the source and the drain in a non-conducting state is preferably used.

In the configuration of the memory cell 500 shown in FIG. 22A, a potential based on written data is held by keeping the non-conducting state. Thus, it is particularly preferable to use a transistor having a low off-state current as a switch for suppressing variation in the potential in the floating node FN which is accompanied by the transfer of electric charge. Note that a method for estimating the off-state current of a transistor having a low off-state current is described later.

When a transistor having a low off-state current is used as the transistor 511 and the memory cell 500 is kept turned off, the memory cell 500 can be a non-volatile memory. Thus, once data is written to the memory cell 500, the data can be held in the floating node FN until the transistor 511 is turned on again.

In the transistor 512, a drain current $I_d$ flows between the source and the drain in accordance with the potential of the floating node FN. Note that in the memory cell 500 shown in FIG. 22A, the drain current $I_d$ that flows between the source and the drain of the transistor 512 is a current that flows between the bit line BL and the power supply line SL. Note that the transistor 512 is also referred to as a second transistor. The transistor 512 is an n-channel transistor in the description.

In the transistor 513, the drain current $I_d$ flows between the source and the drain in accordance with the potential of the read word line RWL. Note that in the memory cell 500 shown in FIG. 22A, the drain current $I_d$ that flows between the source and the drain of the transistor 513 is a current that flows between the bit line BL and the power supply line SL. Note that the transistor 513 is also referred to as a third transistor. The transistor 513 is an n-channel transistor in the description.

The transistor 512 and the transistor 513 preferably have a small fluctuation in threshold voltage. Here, transistors with a small fluctuation in threshold voltage mean transistors that are manufactured in the same process and have an acceptable difference in threshold voltage of 20 mV or lower; a specific example of the transistors is transistors formed using single crystal silicon in channels. It is needless to say that the fluctuation in threshold voltage is preferably as small as possible; however, even the transistors including single crystal silicon may have a difference in threshold voltage of approximately 20 mV.

Next, operation of the memory cell 500 illustrated in FIG. 22A is described.

Figure 22B:
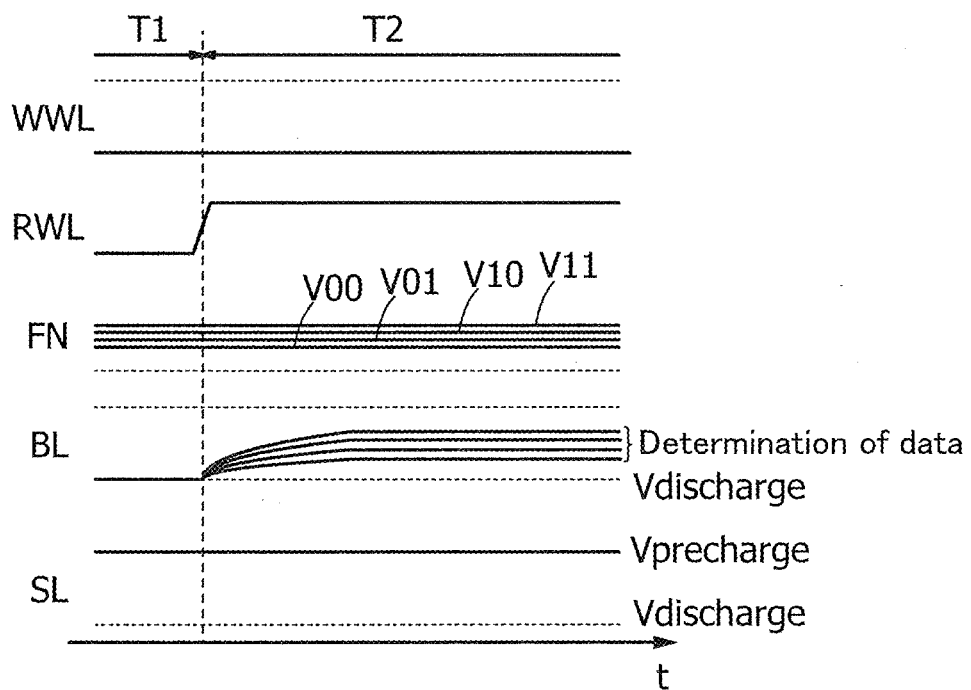

FIG. 22B is a timing chart illustrating changes of signals supplied to the write word line WWL, the read word line RWL, the floating node FN, the bit line BL, and the power supply line SL which are shown in FIG. 22A.

The following periods are illustrated in the timing chart of FIG. 22B: a period T1 which is in an initial state; and a period T2 in which the potential of the bit line BL is charged to perform reading of data.

In the period T1 of FIG. 22B, the electric charge of the bit line BL is discharged. At this time, the write word line WWL is supplied with a low-level potential. The read word line RWL is supplied with a low-level potential. The floating node FN holds a potential corresponding to the multilevel data. The bit line BL is supplied with a discharge voltage $V_{discharge}$. The power supply line SL is supplied with a precharge voltage $V_{precharge}$.

Note that as an example of the multilevel data, 2-bit data, i.e., 4-level data is shown in FIG. 22B. Specifically, 4-level data ($V_{00}, V_{01}, V_{10}$, and $V_{11}$) are shown in FIG. 22B, and the data can be represented by four levels of potentials.

The bit line BL is brought into an electrically floating state after the discharge voltage $V_{discharge}$ is supplied. That is, the bit line BL is brought into a state in which the potential is varied by the charging or discharging of electrical charge. The floating state can be achieved by turning off a switch for supplying a potential to the bit line BL.

Next, in the period T2 of FIG. 22B, the potential of the bit line BL is charged to perform reading of data. At this time, the write word line WWL is supplied with the low-level potential as in the previous period. The read word line RWL is supplied with a high-level potential. In the floating node FN, the potential corresponding to the multilevel data is held as in the previous period. In the bit line BL, the discharge voltage $V_{discharge}$ is increased in accordance with the potential of the floating node FN. The power supply line SL is supplied with the precharge voltage $V_{precharge}$ as in the previous period.

The transistor 513 is turned on in accordance with the change in the potential of the read word line RWL. Thus, the potential of one of the source and the drain of the transistor 512 is lowered to be the discharge voltage $V_{discharge}$.

The transistor 512 is an n-channel transistor. When the potential of one of the source and the drain of the transistor 512 is lowered to be the discharge voltage $V_{discharge}$, the absolute value of a voltage between the gate and the source (gate voltage) is increased. With the increase in the gate voltage, the drain current $I_d$ flows between the source and the drain of each of the transistors 512 and 513.

When the drain current $I_d$ flows in each of the transistor 512 and the transistor 513, the electric charge of the power supply line SL is stored to the bit line BL. The potential of the source of the transistor 512 and the potential of the bit line BL are raised by the charging. The raising of the potential in the source of the transistor 512 leads to a gradual decrease in gate voltage of the transistor 512.

When gate voltage of the transistor 512 reaches threshold voltage, the drain current $I_d$ that flows in the period T2 stops flowing. Therefore, the raising of the potential in the bit line BL proceeds, and when the gate voltage of the transistor 512 reaches the threshold voltage, the charging is completed and the bit line BL has a constant potential. The potential of the bit line BL at this time corresponds approximately to a difference between the potential of the floating node FN and the threshold voltage.

That is, the potential of the floating node FN can be reflected in the potential of the bit line BL which is changed by the charging. The difference in the potential is used to determine the multilevel data. In this manner, the multilevel data written to the memory cell 500 can be read.

Accordingly, the multilevel data can be read from the memory cell without switching a signal for reading data in accordance with the number of levels of the multilevel data.

<Memory 2>

A circuit configuration of a semiconductor memory device that is different from that of Memory 1 and operation of the semiconductor memory device are described with reference to FIGS. 23A and 23B.

Figure 23A:
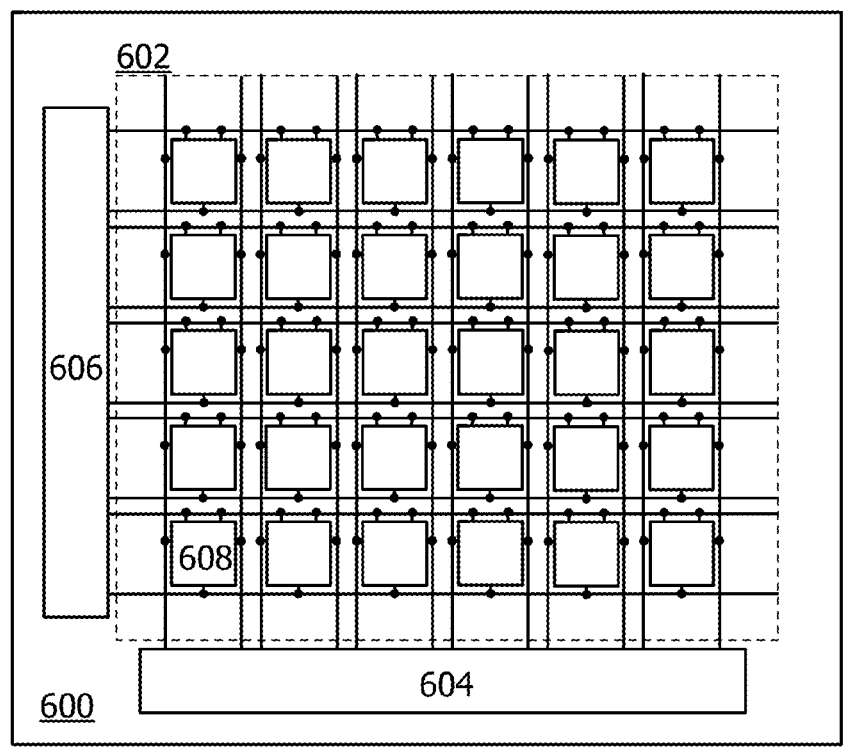
FIGS. 23A and 23B are a block diagram and a circuit diagram illustrating an example of a semiconductor memory device of one embodiment of the present invention.

As the semiconductor memory device that is one embodiment of the present invention, a memory device 600 is shown in FIG. 23A. The memory device 600 shown in FIG. 23A includes a memory element portion 602, a first driver circuit 604, and a second driver circuit 606.

A plurality of memory elements 608 are arranged in matrix in the memory element portion 602. In the example illustrated in FIG. 23A, the memory elements 608 are arranged in five rows and six columns in the memory element portion 602.

The first driver circuit 604 and the second driver circuit 606 control supply of signals to the memory elements 608, and obtain signals from the memory elements 608 in reading. For example, the first driver circuit 604 serves as a word line driver circuit and the second driver circuit 606 serves as a bit line driver circuit. Note that one embodiment of the present invention is not limited thereto, and the first driver circuit 604 and the second driver circuit 606 may serve as a bit line driver circuit and a word line driver circuit, respectively.

The first driver circuit 604 and the second driver circuit 606 are each electrically connected to the memory elements 608 through wirings.

The memory elements 608 each include a volatile memory and a non-volatile memory. FIG. 23B illustrates a specific example of a circuit configuration of the memory element 608. The memory element 608 shown in FIG. 23B includes a first memory circuit 610 and a second memory circuit 612.

The first memory circuit 610 includes a first transistor 614, a second transistor 616, a third transistor 618, a fourth transistor 620, a fifth transistor 622, and a sixth transistor 624.

First, a configuration of the first memory circuit 610 is described. One of a source and a drain of the first transistor 614 is electrically connected to a first terminal 630, and a gate of the first transistor 614 is electrically connected to a second terminal 632. One of a source and a drain of the second transistor 616 is electrically connected to a high potential power supply line Vdd. The other of the source and the drain of the second transistor 616 is electrically connected to the other of the source and the drain of the first transistor 614, one of a source and a drain of the third transistor 618, and a first data holding portion 640. The other of the source and the drain of the third transistor 618 is electrically connected to a low potential power supply line Vss. A gate of the second transistor 616 and a gate of the third transistor 618 are electrically connected to a second data storage portion 642.

One of a source and a drain of the fourth transistor 620 is electrically connected to a third terminal 634. A gate of the fourth transistor 620 is electrically connected to a fourth terminal 636. One of a source and a drain of the fifth transistor 622 is electrically connected to the high potential power supply line Vdd. The other of the source and the drain of the fifth transistor 622 is electrically connected to the other of the source and the drain of the fourth transistor 620, one of a source and a drain of the sixth transistor 624, and the second data holding portion 642. The other of the source and the drain of the sixth transistor 624 is electrically connected to the low potential power supply line Vss. A gate of the fifth transistor 622 and a gate of the sixth transistor 624 are electrically connected to the first data holding portion 640.

The first transistor 614, the third transistor 618, the fourth transistor 620, and the sixth transistor 624 are n-channel transistors.

The second transistor 616 and the fifth transistor 622 are p-channel transistors.

The first terminal 630 is electrically connected to a bit line. The second terminal 632 is electrically connected to a first word line. The third terminal 634 is electrically connected to an inverted bit line. The fourth terminal 636 is electrically connected to the first word line.

The first memory circuit 610 having the above-described configuration is an SRAM. In other words, the first memory circuit 610 is a volatile memory. In the memory device 600, which is one embodiment of the present invention, the first data holding portion 640 and the second data holding portion 642, which are provided in the first memory circuit 610, are electrically connected to the second memory circuit 612.

The second memory circuit 612 includes a seventh transistor 626 and an eighth transistor 628.

Next, a configuration of the second memory circuit 612 is described. One of a source and a drain of the seventh transistor 626 is electrically connected to the second data holding portion 642. The other of the source and the drain of the seventh transistor 626 is electrically connected to one electrode of a first capacitor 648. The other electrode of the first capacitor 648 is electrically connected to the low potential power supply line Vss. One of a source and a drain of the eighth transistor 628 is electrically connected to the first data holding portion 640. The other of the source and the drain of the eighth transistor 628 is electrically connected to one electrode of a second capacitor 650. The other electrode of the second capacitor 650 is electrically connected to the low potential power supply line Vss. A gate of the seventh transistor 626 and a gate of the eighth transistor 628 are electrically connected to a fifth terminal 638.

The fifth terminal 638 is electrically connected to a second word line. Note that a signal of one of the first word line and the second word line may be controlled by the operation of the other, or alternatively, they may be controlled independently from each other.

The seventh transistor 626 and the eighth transistor 628 are each a transistor having a low off-state current. In the configuration shown in FIG. 23B, the seventh transistor 626 and the eighth transistor 628 are n-channel transistors; however, one embodiment of the present invention is not limited thereto.

A third data storage portion 644 is formed between the seventh transistor 626 and the one electrode of the first capacitor 648. A fourth data holding portion 646 is formed between the eighth transistor 628 and the one electrode of the second capacitor 650. Since the seventh transistor 626 and the eighth transistor 628 each have a low off-state current, electric charges in the third data holding portion 644 and the fourth data holding portion 646 can be stored for a long time. In other words, the second memory circuit 612 is a non-volatile memory.

As described above, the first memory circuit 610 is a volatile memory and the second memory circuit 612 is a non-volatile memory. The first data storage portion 640 and the second data storage portion 642, which are the data storage portions in the first memory circuit 610, are electrically connected to the third data storage portion 644 and the fourth data storage portion 646, which are the data storage portions in the second memory circuit 612, through the transistors each having a low off-state current. Thus, by controlling the gate potentials of the transistors each having a low off-state current, the data in the first memory circuit 610 can be stored also in the data holding portion of the second memory circuit 612. Moreover, the use of the transistors each having a low off-state current enables stored data to be held in the third data holding portion 644 and the fourth data holding portion 646 for a long period even when power is not supplied to the memory element 608.

Figure 23B:
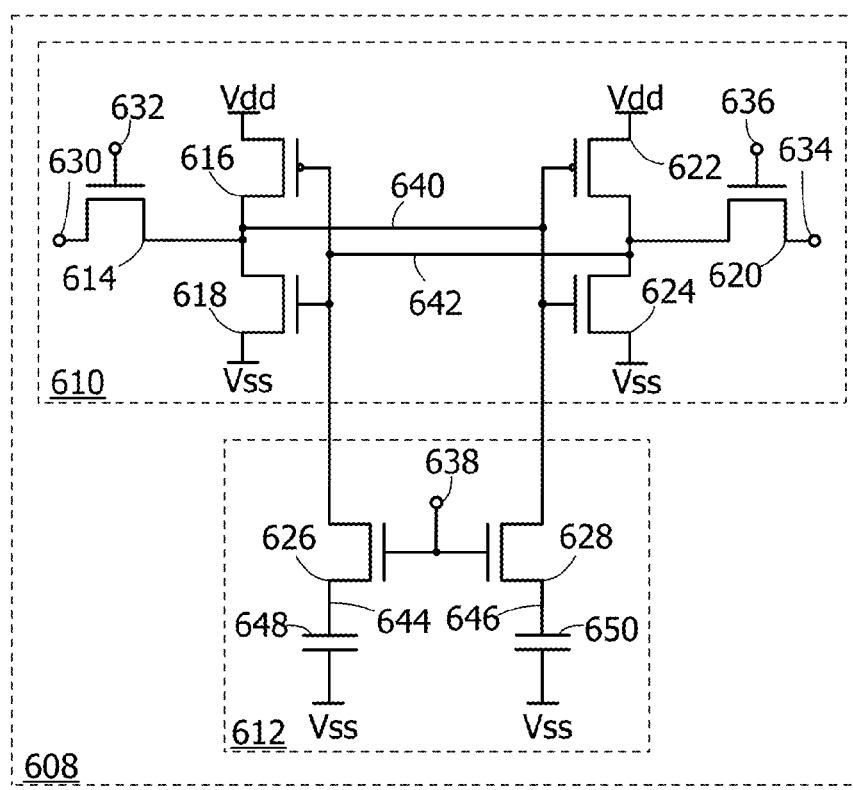

In this manner, in the memory element 608 shown in FIG. 23B, data in the volatile memory can be stored in the non-volatile memory.

The first memory circuit 610 is an SRAM, and thus needs to operate at high speed. On the other hand, the second memory circuit 612 is required to hold data for a long period after supply of power is stopped. Such requirements can be satisfied by forming the first memory circuit 610 using transistors which are capable of high speed operation and forming the second memory circuit 612 using transistors which have a low off-state current. For example, the first memory circuit 610 may be formed using transistors including silicon, and the second memory circuit 612 may be formed using transistors including an oxide semiconductor film.

In the memory device 600, which is one embodiment of the present invention, when the first transistor 614 and the fourth transistor 620 are turned on so that data is written to the data holding portions in the first memory circuit 610, which is a volatile memory, in the case where the seventh transistor 626 and the eighth transistor 628, which are included in the second memory circuit 612, are on, it is necessary to accumulate electric charges in the first capacitor 648 and the second capacitor 650, which are included in the second memory circuit 612, in order that the data holding portions (the first data holding portion 640 and the second data holding portion 642) in the first memory circuit 610 each hold a predetermined potential. Therefore, the seventh transistor 626 and the eighth transistor 628 which are on when data is written to the data holding portions in the first memory circuit 610 hinder the memory element 608 from operating at high speed. In the case where the second memory circuit 612 is formed using transistors including silicon, it is difficult to sufficiently reduce the off-state current and hold stored data in second memory circuit 612 for a long period.

Thus, in the semiconductor memory device, which is one embodiment of the present invention, when data is written to the data holding portions in the first memory circuit 610 (the volatile memory), transistors (i.e., the seventh transistor 626 and the eighth transistor 628) which are positioned between the data holding portions in the first memory circuit 610 and the data holding portions in the second memory circuit 612 are turned off. In this manner, a high speed operation of the memory element 608 can be achieved. Furthermore, when neither writing nor reading to/from the data holding portions in the first memory circuit 610 is performed (i.e., the first transistor 614 and the fourth transistor 620 are off), the transistors which are positioned between the data holding portions in the first memory circuit 610 and the data holding portions in the second memory circuit 612 are turned on.

A specific operation of data writing to the volatile memory in the memory element 608 is described below. First, the seventh transistor 626 and the eighth transistor 628 which are on are turned off. Next, the first transistor 614 and the fourth transistor 620 are turned on to supply a predetermined potential to the data holding portions (the first data holding portion 640 and the second data holding portion 642) in the first memory circuit 610, and then the first transistor 614 and the fourth transistor 620 are turned off. After that, the seventh transistor 626 and the eighth transistor 628 are turned on. In this manner, data corresponding to data held in the data holding portions in the first memory circuit 610 is held in the data holding portions in the second memory circuit 612.

When the first transistor 614 and the fourth transistor 620 are turned on at least for data writing to the data holding portions in the first memory circuit 610, it is necessary to turn off the seventh transistor 626 and the eighth transistor 628, which are included in the second memory circuit 612. Note that the seventh transistor 626 and the eighth transistor 628, which are included in the second memory circuit 612, may be either on or off when the first transistor 614 and the fourth transistor 620 are turned on for data reading from the data holding portions in the first memory circuit 610.

In the case where supply of power to the memory element 608 is stopped, the transistors positioned between the data holding portions in the first memory circuit 610 and the data holding portions in the second memory circuit 612 (i.e., the seventh transistor 626 and the eighth transistor 628) are turned off just before supply of power to the memory element 608 is stopped, so that the data held in the second memory circuit 612 becomes non-volatile. A means for turning off the seventh transistor 626 and the eighth transistor 628 just before supply of power to the volatile memory is stopped may be mounted on the first driver circuit 604 and the second driver circuit 606, or may alternatively be provided in another control circuit for controlling these driver circuits.

Note that here, whether the seventh transistor 626 and the eighth transistor 628, which are positioned between the data holding portions in the first memory circuit 610 and the data holding portions in the second memory circuit 612, are turned on or off may be determined in each memory element or may be determined in each block in the case where the memory element portion 602 is divided into blocks.

When the first memory circuit 610 operates as an SRAM, the transistors which are positioned between the data holding portions in the first memory circuit 610 and the data holding portions in the second memory circuit 612 are turned off; accordingly, data can be stored in the first memory circuit 610 without accumulation of an electric charge in the first capacitor 648 and the second capacitor 650, which are included in the second memory circuit 612. Thus, the memory element 608 can operate at high speed.

In the memory device 600, which is one embodiment of the present invention, before supply of power to the memory device 600 is stopped (a power source of the memory device 600 is turned off), only the transistors which are positioned between the data holding portions in the first memory circuit 610 and the data holding portions in the second storage circuit 612 in the memory element 608 to which data has been rewritten lastly may be turned on. In that case, an address of the memory element 608 to which data has been rewritten lastly is preferably stored in an external memory, in which case the data can be stored smoothly.

Note that the driving method of the semiconductor memory device, which is one embodiment of the present invention, is not limited to the above description.

As described above, the memory device 600 can operate at high speed. Since data storing is performed only by part of the memory elements, power consumption can be reduced.

Although an SRAM is used here as the volatile memory, one embodiment of the present invention is not limited thereto, and other volatile memories may be used.

<CPU>

Figure 24A:
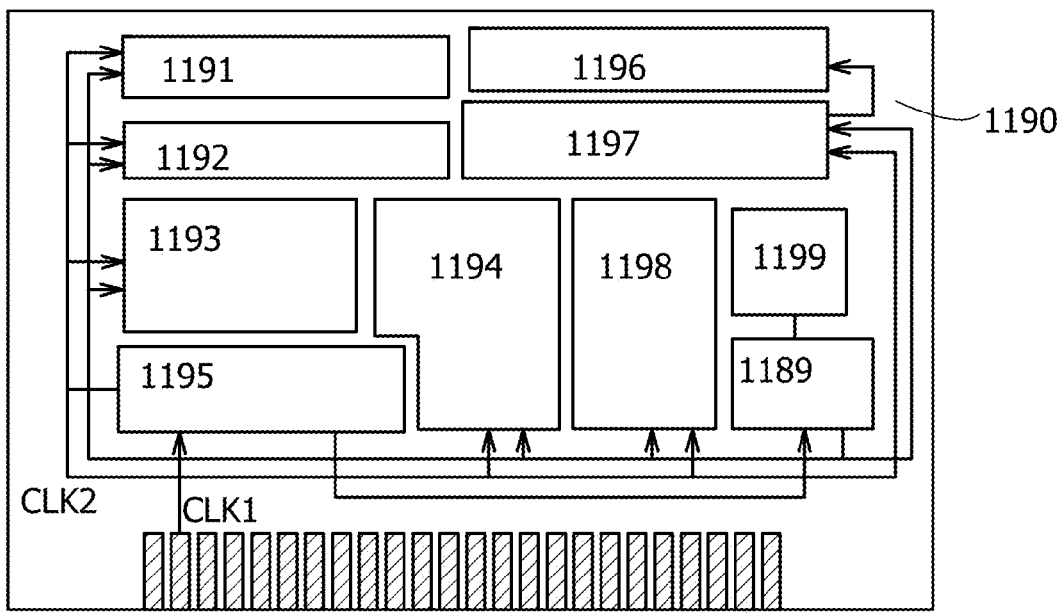
FIGS. 24A to 24C are block diagrams illustrating examples of a CPU of one embodiment of the present invention.
Figure 24B:
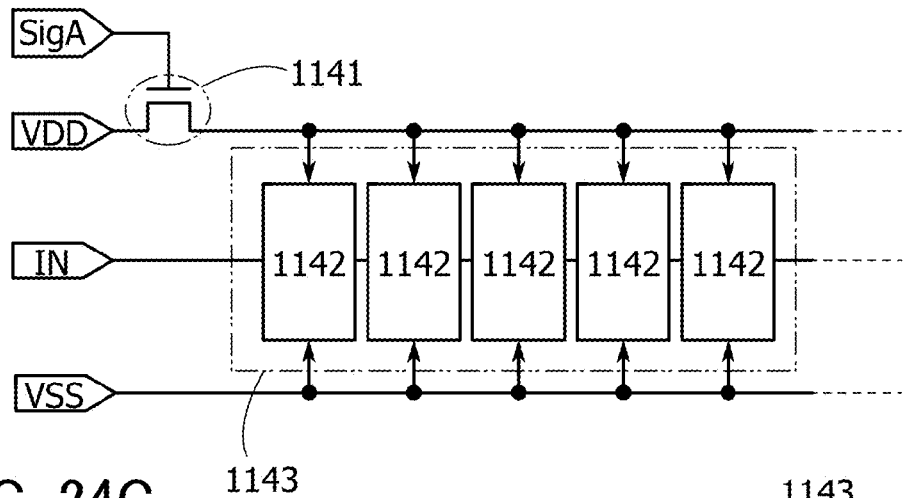
Figure 24C:
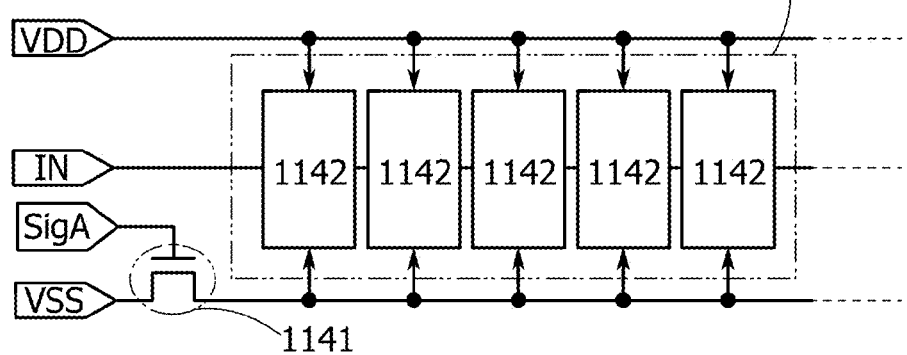

FIGS. 24A to 24C are block diagrams showing a specific configuration of a CPU at least partly including the above transistor or semiconductor memory device.

The CPU shown in FIG. 24A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 24A is just an example in which the structure is simplified, and an actual CPU may have a variety of structures depending on the application.

An instruction that is input into the CPU through the bus interface 1198 is input into the instruction decoder 1193 and decoded therein, and then, input into the ALU controller 1192, the interrupt controller 1194, the register controller 1197, and the timing controller 1195.

The ALU controller 1192, the interrupt controller 1194, the register controller 1197, and the timing controller 1195 conduct a variety of controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU shown in FIG. 24A, a memory cell is provided in the register 1196. As the memory cell of the register 1196, the above-described transistor can be used.

In the CPU shown in FIG. 24A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten to the capacitor, and supply of power supply voltage to the memory cell in the register 1196 can be stopped.

The power supply can be stopped by providing a switching element between a memory cell group and a node to which a high-level power supply potential VDD or a low-level power supply potential VSS is supplied, as shown in FIG. 24B or FIG. 24C. Circuits shown in FIGS. 24B and 24C are described below.

FIGS. 24B and 24C are each a memory device in which the above transistor is used as a switching element for controlling power supply potential supplied to memory cells.

The memory device shown in FIG. 24B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD through the switching element 1141. Furthermore, each of the memory cells 1142 included in the memory cell group 1143 is supplied with a potential of a signal IN and the low-level power supply potential VSS.

In FIG. 24B, any of the above transistors is used as the switching element 1141, and the switching of the transistor is controlled by a signal SigA supplied to a gate electrode layer thereof.

Note that FIG. 24B shows the structure in which the switching element 1141 includes only one transistor; however, without particular limitation thereon, the switching element 1141 may include a plurality of transistors. The switching element 1141 may include a plurality of transistors. In the case where the switching element 1141 includes a plurality of transistors which functions as switching elements, the plurality of transistors may be connected to each other in parallel, in series, or in combination of parallel connection and serial connection.

Although the switching element 1141 controls the supply of the high-level power supply potential VDD to each of the memory cells 1142 included in the memory cell group 1143 in FIG. 24B, the switching element 1141 may control the supply of the low-level power supply potential VSS.

In FIG. 24C, an example of a memory device in which each of the memory cells 1142 included in the memory cell group 1143 is supplied with the low-level power supply potential VSS through the switching element 1141 is shown. The supply of the low-level power supply potential VSS to each of the memory cells 1142 included in the memory cell group 1143 can be controlled by the switching element 1141.

When a switching element is provided between a memory cell group and a node to which the high-level power supply potential VDD or the low-level power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data into an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

INSTALLATION EXAMPLE

Figure 25A:
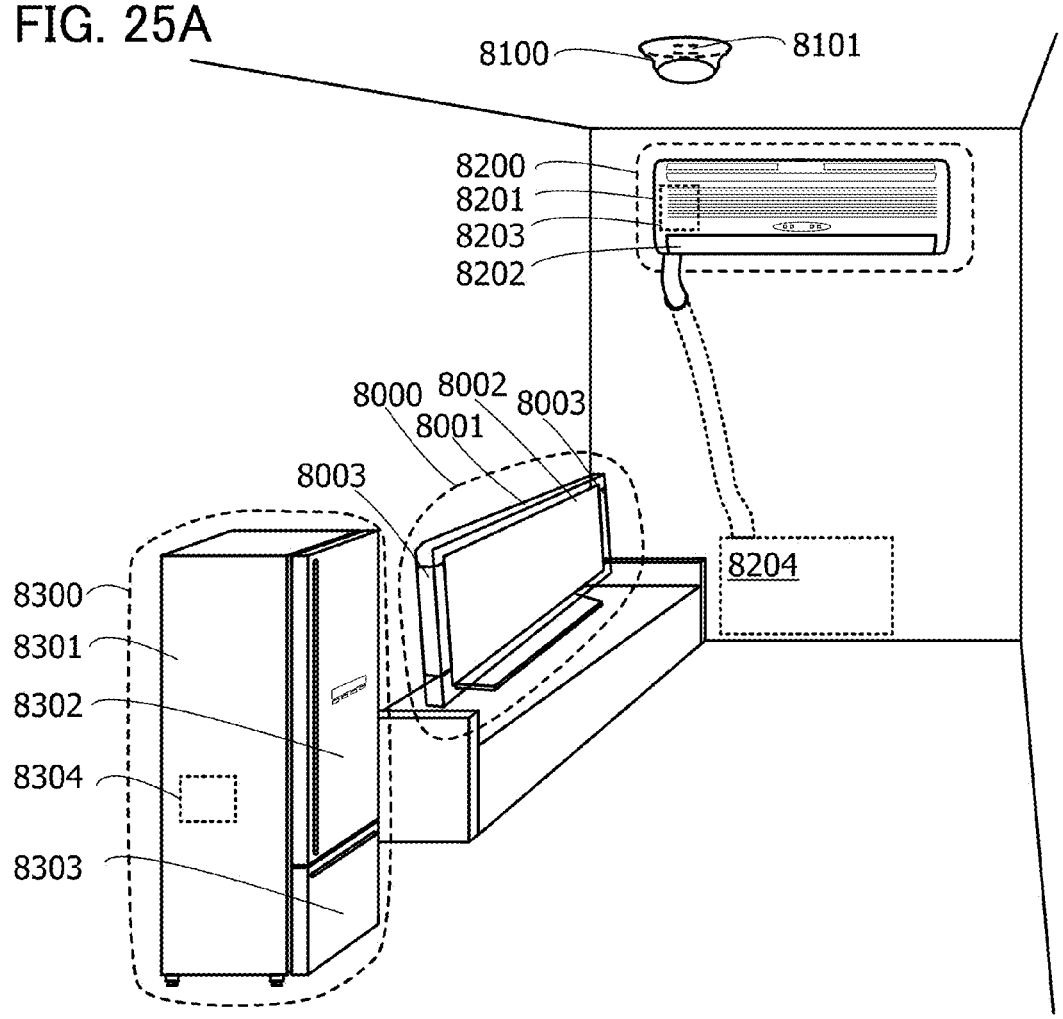
FIGS. 25A to 25C illustrate installation examples of a semiconductor device of one embodiment of the present invention.

In a television set 8000 in FIG. 25A, a display portion 8002 is incorporated in a housing 8001. The display portion 8002 displays an image and a speaker portion 8003 can output sound.

The television set 8000 may be provided with a receiver, a modem, and the like. With the receiver, the television set 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The above display device, memory, or CPU can be used for the television set 8000.

In FIG. 25A, an alarm device 8100 is a residential fire alarm which includes a sensor portion and a microcomputer 8101. Note that the microcomputer 8101 includes a CPU in which the above transistor is used.

In FIG. 25A, a CPU that uses the above transistor is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 25A, the CPU 8203 may be provided in the outdoor unit 8204. Alternatively, the CPU 8203 may be provided in both the indoor unit 8200 and the outdoor unit 8204. When the air conditioner includes the CPU in which the above transistor is used, a reduction in power consumption of the air conditioner can be achieved.

In FIG. 25A, an electric refrigerator-freezer 8300 includes the CPU in which the above transistor is used. Specifically, the electric refrigerator-freezer 8300 includes a housing 8301, a door for a refrigerator 8302, a door for a freezer 8303, a CPU 8304, and the like. In FIG. 25A, the CPU 8304 is provided in the housing 8301. When the electric refrigerator-freezer 8300 includes the CPU in which the above transistor is used, a reduction in power consumption of the electric refrigerator-freezer 8300 can be achieved.

Figure 25B:
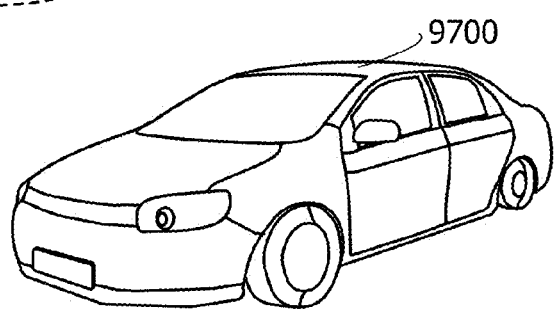
Figure 25C:
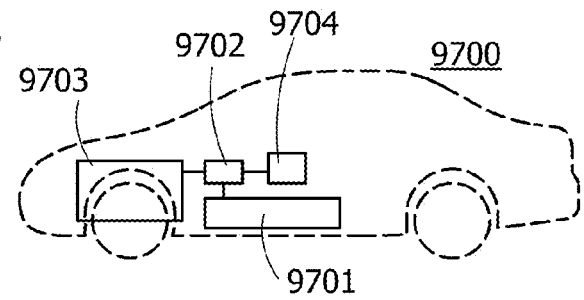

FIGS. 25B and 25C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the electric vehicle 9700 includes the CPU in which the above transistor is used, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment illustrates an example of a basic principle. Thus, part or the whole of this embodiment can be freely combined with, applied to, or replaced with part or the whole of another embodiment.

REFERENCE NUMERALS

100: pellet, 120: ion, 130: region, 150: substrate, 160: backing plate, 170a: magnet, 170b: magnet, 170c: magnet, 180: target, 185: cleavage plane, 190: magnetic force line, 200: substrate, 202: base insulating film, 204: gate electrode, 206: oxide semiconductor film, 212: gate insulating film, 216a: source electrode, 216b: drain electrode, 218: protective insulating film, 226a: wiring, 226b: wiring, 300: substrate, 304: gate electrode, 306: oxide semiconductor film, 312: gate insulating film, 316a: source electrode, 316b: drain electrode, 318: protective insulating film, 326a: wiring, 326b: wiring, 500: memory cell, 511: transistor, 512: transistor, 513: transistor, 514: capacitor, 600: memory device, 602: memory element portion, 604: driver circuit, 606: driver circuit, 608: memory element, 610: memory circuit, 612: memory circuit, 614: transistor, 616: transistor, 618: transistor, 620: transistor, 622: transistor, 624: transistor, 626: transistor, 628: transistor, 630: terminal, 632: terminal, 634: terminal, 636: terminal, 638: terminal, 640: data holding portion, 642: data holding portion, 644: data holding portion, 646: data holding portion, 648: capacitor, 650: capacitor, 700: substrate, 719: light-emitting element, 720: insulating film, 721: insulating film, 731: terminal, 732: FPC, 733a: wiring, 734: seal material, 735: driver circuit, 736: driver circuit, 737: pixel, 741: transistor, 742: capacitor, 743: switching element, 744: signal line, 750: pixel, 751: transistor, 752: capacitor, 753: liquid crystal element, 754: scan line, 755: signal line, 781: electrode, 782: light-emitting layer, 783: electrode, 784: bank, 791: electrode, 792: insulating film, 793: liquid crystal layer, 794: insulating film, 795: spacer, 796: electrode, 797: substrate, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 8000: television set, 8001: housing, 8002: display portion, 8003: speaker portion, 8100: alarm device, 8101: microcomputer, 8200: indoor unit, 8201: housing, 8202: air outlet, 8203: CPU, 8204: outdoor unit, 8300: electric refrigerator-freezer, 8301: housing, 8302: door for a refrigerator, 8303: door for a freezer, 8304: CPU, 9700: electric vehicle, 9701: secondary battery, 9702: control circuit, 9703: driving device, 9704: processing unit.

This application is based on Japanese Patent Application serial no. 2013-128481 filed with Japan Patent Office on Jun. 19, 2013, the entire contents of which are hereby incorporated by reference.

The invention claimed is:

1. A display device comprising:
    a gate electrode;
    an oxide semiconductor film;
    a gate insulating layer between the gate electrode and the oxide semiconductor film;
    a source electrode and a drain electrode each electrically connected to the oxide semiconductor film;
    an insulating layer over the source electrode and the drain electrode; and
    an electrode over the insulating layer electrically connected to one of the source electrode and the drain electrode,
    wherein the oxide semiconductor film comprises a plurality of plate particles,
    wherein the plurality of plate particles are arranged irregularly, and
    wherein the plurality of plate particles each have regularity in atomic arrangement.

2. The display device according to claim 1, wherein a crystal boundary in the oxide semiconductor film is not observed by using a transmission electron microscope.

3. The display device according to claim 1, wherein the plurality of plate particles each have a thickness of greater than or equal to 0.5 nm and less than or equal to 0.9 nm and an equivalent circle diameter of greater than or equal to 1 nm and less than or equal to 3 nm.

4. The display device according to claim 1, wherein a plurality of circumferentially distributed spots are observed in a nanobeam electron diffraction pattern of the oxide semiconductor film.

5. The display device according to claim 4, wherein a probe diameter of an electron beam is larger than or equal to 1 nm and smaller than or equal to 30 nm.

6. The display device according to claim 1,
    wherein the plurality of plate particles each have a crystal part.

7. A display device comprising:
    a gate electrode;
    a gate insulating layer over the gate electrode;
    an oxide semiconductor film over the gate insulating layer;
    a source electrode and a drain electrode each electrically connected to the oxide semiconductor film;
    an insulating layer over the source electrode and the drain electrode; and
    an electrode over the insulating layer electrically connected to one of the source electrode and the drain electrode,
    wherein the oxide semiconductor film comprises a plurality of plate particles each including indium, gallium, zinc, and oxygen,
    wherein the plurality of plate particles are arranged irregularly, and
    wherein the plurality of plate particles each have regularity in atomic arrangement.

8. The display device according to claim 7, wherein a crystal boundary in the oxide semiconductor film is not observed by using a transmission electron microscope.

9. The display device according to claim 7, wherein the plurality of plate particles each have a thickness of greater than or equal to 0.5 nm and less than or equal to 0.9 nm and an equivalent circle diameter of a plane of greater than or equal to 1 nm and less than or equal to 3 nm.

10. The display device according to claim 7, wherein a plurality of circumferentially distributed spots are observed in a nanobeam electron diffraction pattern of the oxide semiconductor film.

11. The display device according to claim 10, wherein a probe diameter of an electron beam is larger than or equal to 1 nm and smaller than or equal to 30 nm.

12. The display device according to claim 7, wherein the plurality of plate particles each have a crystal part.

13. A display device comprising:
a transistor comprising:
a gate electrode,
an oxide semiconductor film,
a gate insulating layer between the gate electrode and the oxide semiconductor film, and
a source electrode and a drain electrode electrically connected to the oxide semiconductor film; and
a capacitor comprising:
a first electrode,
one of the source electrode and the drain electrode, and
a first insulating layer between the first electrode and the one of the source electrode and the drain electrode;
a second insulating layer over the transistor and the capacitor; and
an electrode over the second insulating layer electrically connected to the one of the source electrode and the drain electrode,
wherein the oxide semiconductor film comprises a plurality of plate particles,
wherein the plurality of plate particles are arranged irregularly, and
wherein the plurality of plate particles each have regularity in atomic arrangement.

14. The display device according to claim 13, wherein a crystal boundary in the oxide semiconductor film is not observed by using a transmission electron microscope.

15. The display device according to claim 13, wherein the plurality of plate particles each have a thickness of greater than or equal to 0.5 nm and less than or equal to 0.9 nm and an equivalent circle diameter of a plane of greater than or equal to 1 nm and less than or equal to 3 nm.

16. The display device according to claim 13, wherein a plurality of circumferentially distributed spots are observed in a nanobeam electron diffraction pattern of the oxide semiconductor film.

17. The display device according to claim 16, wherein a probe diameter of an electron beam is larger than or equal to 1 nm and smaller than or equal to 30 nm.

18. The display device according to claim 13, wherein the plurality of plate particles each have a crystal part.

* * * * *